US012642141B2

(12) United States Patent
Hu et al.

(10) Patent No.: US 12,642,141 B2
(45) Date of Patent: May 26, 2026

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tian Hu, Hsinchu City (TW); Po-Han Wang, Hsinchu City (TW); Sih-Hao Liao, New Taipei City (TW); Yu-Hsiang Hu, Hsinchu City (TW); Hung-Jui Kuo, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 652 days.

(21) Appl. No.: 18/152,176

(22) Filed: Jan. 10, 2023

(65) Prior Publication Data

US 2024/0113089 A1 Apr. 4, 2024

Related U.S. Application Data

(60) Provisional application No. 63/412,549, filed on Oct. 3, 2022.

(51) Int. Cl.
H01L 25/10 (2006.01)
H01L 21/56 (2006.01)
(Continued)

(52) U.S. Cl.
CPC .......... H01L 25/105 (2013.01); H01L 21/563 (2013.01); H01L 23/3135 (2013.01);
(Continued)

(58) Field of Classification Search
CPC . H01L 25/105; H01L 21/563; H01L 23/3135; H01L 23/3171; H01L 23/3185;
(Continued)

(56) References Cited

U.S. PATENT DOCUMENTS 10,510,631 B2 * 12/2019 Tai ........................... H01L 22/32
10,770,427 B1 * 9/2020 Li ...................... H01L 21/76816
(Continued)

FOREIGN PATENT DOCUMENTS

TW 201030914 8/2010
TW 201913914 4/2019
TW 201916305 4/2019

OTHER PUBLICATIONS

"Office Action of Taiwan Counterpart Application", issued on Jan. 16, 2024, p. 1-p. 7.

*Primary Examiner* — Douglas W Owens
(74) *Attorney, Agent, or Firm* — JCIPRNET

(57) ABSTRACT

A semiconductor package and a manufacturing method thereof are provided. The semiconductor package includes a die, an underfill layer, a patterned dielectric layer and a plurality of conductive terminals. The die has a front surface and a back surface opposite to the front surface. The underfill layer encapsulates the die, wherein a surface of the underfill layer and the back surface of the die are substantially coplanar to one another. The patterned dielectric layer is disposed on the back surface of the die. The conductive terminals are disposed on and in contact with a surface of the patterned dielectric layer and partially embedded in the patterned dielectric layer to be in contact with the die, wherein a portion of the surface of the patterned dielectric layer that directly under each of the conductive terminals is substantially parallel with the back surface of the die.

20 Claims, 19 Drawing Sheets

(51) Int. Cl.
  *H01L 23/00* (2006.01)
  *H01L 23/31* (2006.01)
  *H01L 25/00* (2006.01)

(52) U.S. Cl.
  CPC ...... *H01L 23/3171* (2013.01); *H01L 23/3185* (2013.01); *H01L 24/05* (2013.01); *H01L 24/11* (2013.01); *H01L 24/13* (2013.01); *H01L 24/14* (2013.01); *H01L 24/16* (2013.01); *H01L 24/17* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 24/95* (2013.01); *H01L 25/50* (2013.01); *H01L 21/568* (2013.01); *H01L 2224/04105* (2013.01); *H01L 2224/05022* (2013.01); *H01L 2224/05562* (2013.01); *H01L 2224/05572* (2013.01); *H01L 2224/05624* (2013.01); *H01L 2224/05639* (2013.01); *H01L 2224/05644* (2013.01); *H01L 2224/05647* (2013.01); *H01L 2224/05657* (2013.01); *H01L 2224/05684* (2013.01); *H01L 2224/11462* (2013.01); *H01L 2224/11464* (2013.01); *H01L 2224/11912* (2013.01); *H01L 2224/13021* (2013.01); *H01L 2224/13025* (2013.01); *H01L 2224/13082* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/14131* (2013.01); *H01L 2224/16145* (2013.01); *H01L 2224/16225* (2013.01); *H01L 2224/1703* (2013.01); *H01L 2224/17181* (2013.01); *H01L 2224/2919* (2013.01); *H01L 2224/32145* (2013.01); *H01L 2224/32225* (2013.01); *H01L 2224/73204* (2013.01); *H01L 2224/73253* (2013.01); *H01L 2224/81005* (2013.01); *H01L 2224/81815* (2013.01); *H01L 2224/83005* (2013.01); *H01L 2224/83102* (2013.01); *H01L 2224/8385* (2013.01); *H01L 2224/83947* (2013.01); *H01L 2224/92125* (2013.01); *H01L 2224/95001* (2013.01); *H01L 2924/0665* (2013.01)

(58) Field of Classification Search
  CPC ......... H01L 24/05; H01L 24/11; H01L 24/13; H01L 24/14; H01L 24/16; H01L 24/17; H01L 24/29; H01L 24/32; H01L 24/73; H01L 24/81; H01L 24/83; H01L 24/92; H01L 24/95; H01L 25/50; H01L 21/568; H01L 2224/04105; H01L 2224/05022; H01L 2224/05562; H01L 2224/05572; H01L 2224/11462; H01L 2224/11464; H01L 2224/11912; H01L 2224/13021; H01L 2224/13025; H01L 2224/13082; H01L 2224/14131; H01L 2224/16145; H01L 2224/16225; H01L 2224/1703; H01L 2224/17181; H01L 2224/2919; H01L 2224/32145; H01L 2224/32225; H01L 2224/73204; H01L 2224/73253; H01L 2224/81005; H01L 2224/81815; H01L 2224/83005; H01L 2224/83102; H01L 2224/8385; H01L 2224/83947; H01L 2224/92125; H01L 2224/95001; H01L 2924/0665; H01L 24/01; H01L 24/09; H01L 2221/68318; H01L 2221/68368; H01L 24/20; H01L 21/6835; H01L 2221/68345; H01L 24/19
  See application file for complete search history.

(56) References Cited

U.S. PATENT DOCUMENTS

| | | | | |
|---|---|---|---|---|
| 11,515,274 B2 * | 11/2022 | Liang | ................. | H01L 23/49816 |
| 11,824,040 B2 * | 11/2023 | Wu | .......................... | H01L 23/16 |
| 2015/0255426 A1 * | 9/2015 | Son | ..................... | H01L 23/5385 |
| | | | | 257/738 |
| 2019/0067144 A1 * | 2/2019 | Jeng | ................... | H01L 23/3114 |
| 2021/0125964 A1 * | 4/2021 | Lu | .......................... | H01L 21/561 |
| 2022/0384364 A1 * | 12/2022 | Li | ........................ | H01L 23/3135 |
| 2023/0378133 A1 * | 11/2023 | Wu | .......................... | H01L 23/16 |
| 2024/0088090 A1 * | 3/2024 | Li | ............................ | H01L 24/16 |
| 2025/0201695 A1 * | 6/2025 | Hsieh | ..................... | H01L 24/73 |

* cited by examiner

SEMICONDUCTOR PACKAGE AND MANUFACTURING METHOD THEREOF

CROSS-REFERENCE TO RELATED APPLICATION

This application claims the priority benefit of U.S. provisional application Ser. No. 63/412,549, filed on Oct. 3, 2022. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. How to ensure the reliability of the wafer level packaging has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
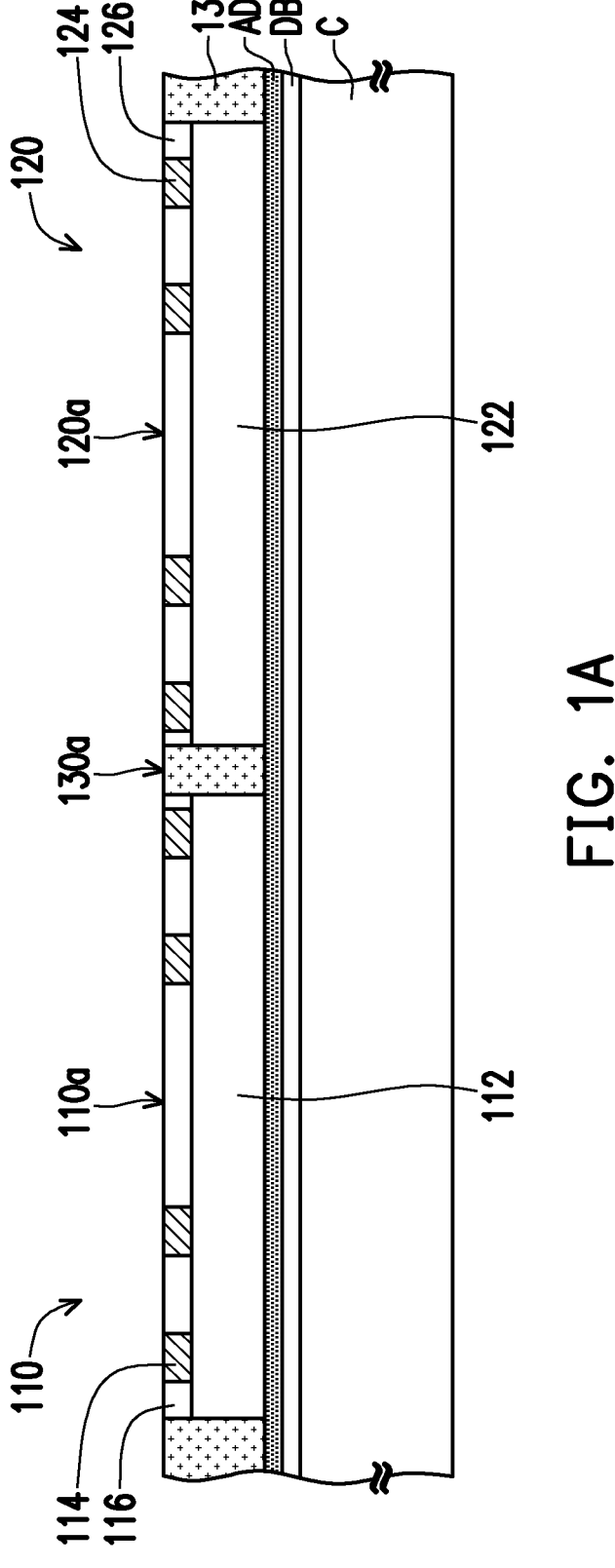
FIG. 1A to FIG. 1J are schematic cross-sectional views of various stages of manufacturing a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1J are schematic cross-sectional views of various stages of manufacturing a semiconductor package 10 in accordance with some embodiments of the disclosure. FIG. 2A is a schematic top view illustrating a portion of the structure in the stage of FIG. 1G in accordance with some embodiments of the disclosure. FIG. 2B and FIG. 2C are schematic top views each illustrating a portion of the structure in the stage of FIG. 1G in accordance with some alternative embodiments of the disclosure.

Figure 2A:
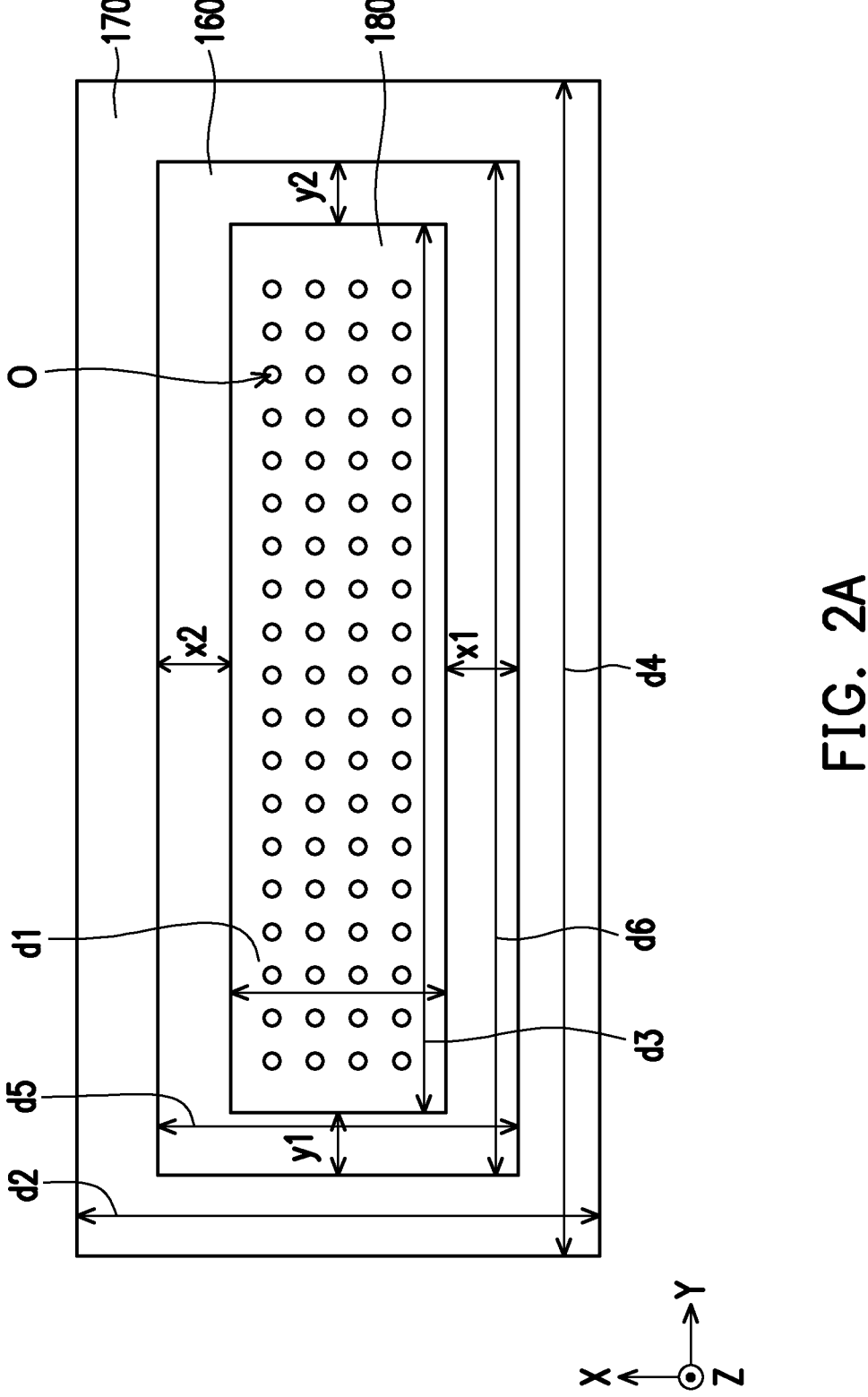
FIG. 2A is a schematic top view illustrating a portion of the structure in the stage of FIG. 1G in accordance with some embodiments of the disclosure.
Figure 2B:
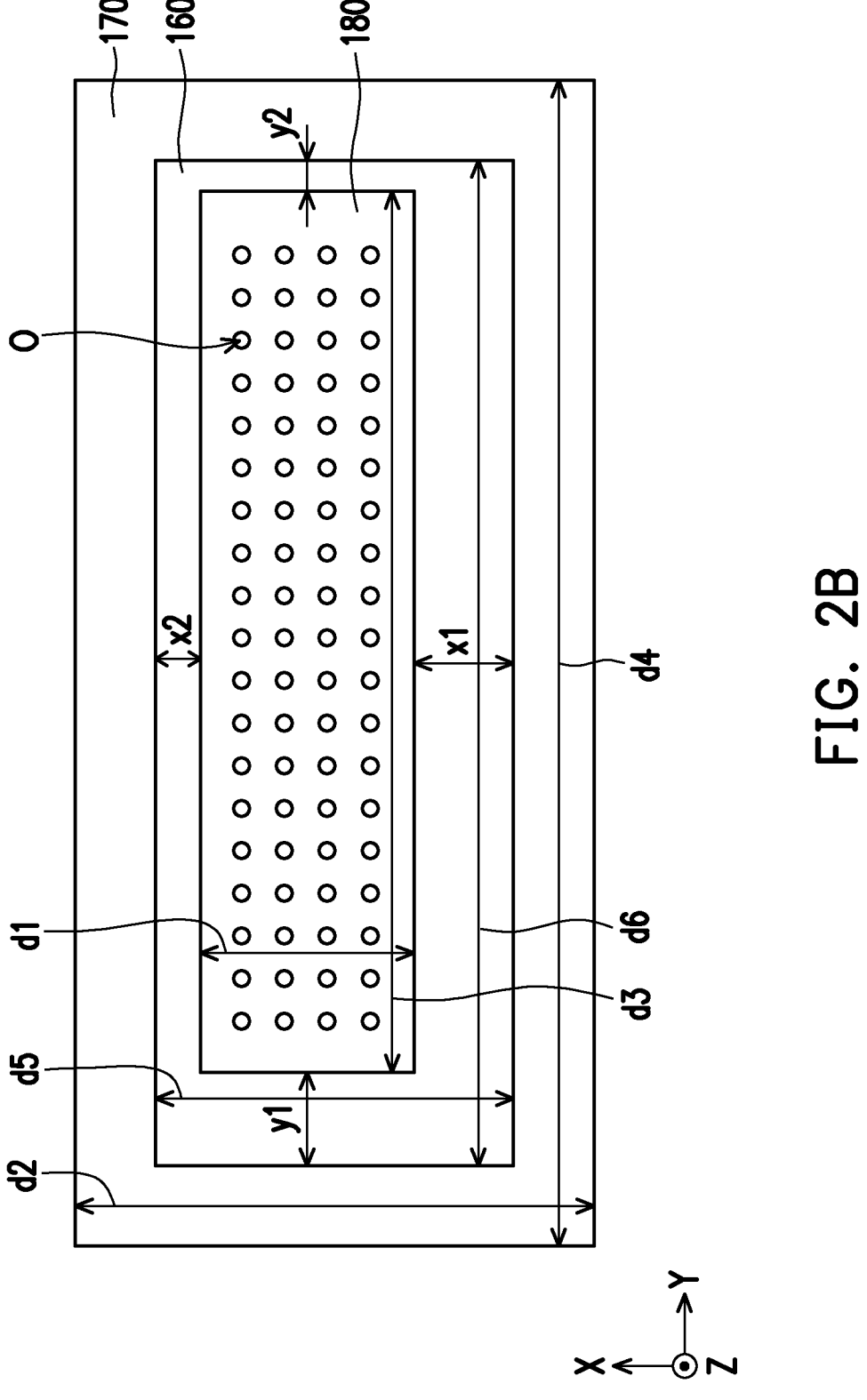
FIG. 2B and FIG. 2C are schematic top views each illustrating a portion of the structure in the stage of FIG. 1G in accordance with some alternative embodiments of the disclosure.
Figure 2C:
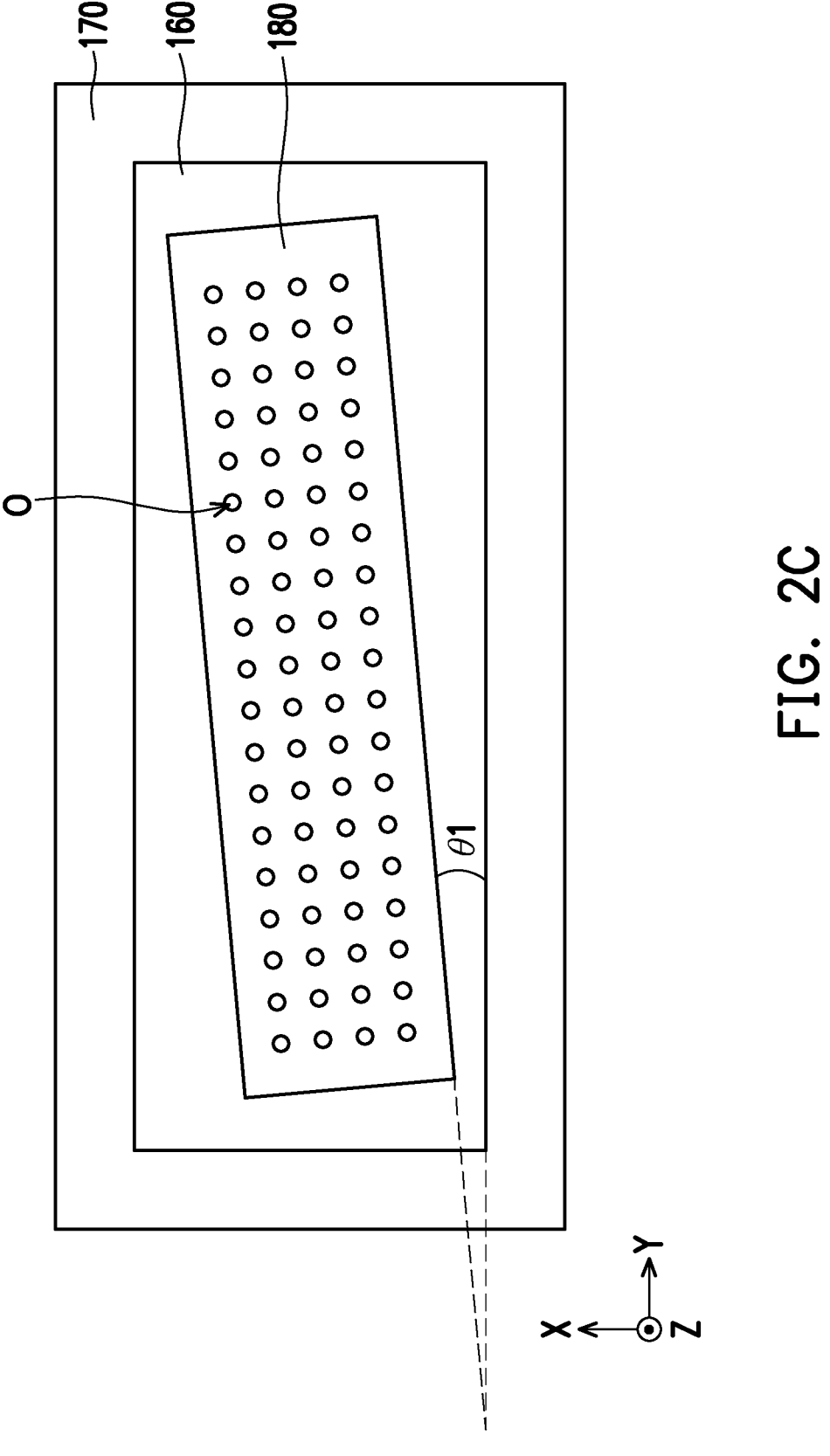

Referring to FIG. 1A, a plurality of semiconductor dies are disposed on a temporary carrier C. For example, after performing a singulation process to separate individual semiconductor dies from a semiconductor wafer (not shown), dies 110, 120 are picked and placed on the temporary carrier C. The temporary carrier C may be a glass carrier, a ceramic carrier, a metal carrier, or the like. After the dies 110, 120 are disposed side by side on the temporary carrier C, a gap is formed between the dies 110, 120. In some embodiments, the dies 110, 120 are attached onto the temporary carrier C through an adhesive layer AD. The adhesive layer AD may be a die attach film (DAF) or other suitable adhesive material. In some embodiments, a de-bonding layer DB is further formed between the temporary carrier C and the adhesive layer AD. In some embodiments, the de-bonding layer DB is formed of an adhesive such as Ultra-Violet (UV) glue, Light-to-Heat Conversion (LTHC) glue, or other types of adhesives. In some embodiments, the de-bonding layer DB is decomposable under the heat of light to release the temporary carrier C from the overlying structures that will be formed in subsequent steps. In some alternative embodiments, a buffer layer mt5ay be formed between the de-bonding layer DB and the temporary carrier C. The buffer layer may include a dielectric material layer made of a dielectric material including benzocyclobutene ("BCB"), polybenzooxazole ("PBO"), or any other suitable polymer-based dielectric material.

The die 110 may include a semiconductor substrate 112, conductive connectors 114 distributed on the semiconductor substrate 112, and a protection layer 116 disposed on the semiconductor substrate 112 and surrounding the conductive connectors 114 for protection. In some embodiments, the die 120 includes a similar or the same structure as the die 110. For example, the die 120 includes a semiconductor substrate 122, conductive connectors 124 distributed on the semiconductor substrate 122, and a protection layer 126 disposed on the semiconductor substrate 122 and surrounding the conductive connectors 124 for protection. In some embodiments, the conductive connectors 114 and 124 include conductive pillars, vias, bumps and/or posts made of solder, gold, copper, or any other suitable conductive materials. The conductive connectors 114 and 124 may be formed by an electroplating process or other suitable deposition process. The surface where the conductive connectors 114 are being distributed may be referred to as a front surface 110a (e.g., an active surface) of the die 110 for further electrical connection. Similarly, the surface where the conductive connectors 124 are being distributed may be referred to as a front surface 120a (e.g., an active surface) of the die 120 for further electrical connection. The front surface 120a of the die 120 faces the same direction as the front surface 110a of the die 110. In some embodiments, the material of the protection layer 116 and 126 includes polybenzoxazole, polyimide, a suitable organic or inorganic material, or the like.

The dies 110, 120 may be the same type of semiconductor dies or different types of semiconductor dies. In some embodiments, the dies 110, 120 are singulated from the same semiconductor wafer and may perform same or similar functions. The functions may include memory structures, processing structures, sensors, amplifiers, power distribution, I/O circuitry, or the like. In alternative embodiments, the dies 110, 120 are singulated from the different semiconductor wafers and may perform different functions. In some embodiments, the die 110 and/or the die 120 may include active components (e.g., transistors or the like) and, optionally, passive components (e.g., resistors, capacitors, inductors, etc.) formed on the semiconductor substrate 112 and 122. The die 110 and/or the die 120 may be a logic die, such as a central processing unit (CPU) die, a graphic processing unit (GPU) die, a micro control unit (MCU) die, an input-output (I/O) die, a baseband (BB) die, or an application processor (AP) die. In some embodiments, at least one of the dies 110, 120 may be a System-on-Die (SoC) die or a die stack. In some embodiments, at least one of the dies 110, 120 may be a memory die such as high bandwidth memory (HBM) die. It should be appreciated that the number of the dies and the function of the dies to be packaged may depend on the design requirements.

With reference to FIG. 1A, an encapsulant 130 is formed over the temporary carrier C to encapsulate the dies 110, 120. The encapsulant 130 includes a molding compound (e.g., epoxy resins), a dielectric material such as polybenzoxazole, polyimide, benzocyclobutene, a combination thereof, or other suitable electrically insulating materials. In some embodiments, the method of forming the encapsulant 130 includes at least the following steps. An insulating material (not shown) is formed on the temporary carrier C, so that the dies 110, 120 are over-molded, and the gap between the dies 110, 120 is filled. Next, a thinning process is performed on the insulating material to reduce the thickness of the insulating material until at least a portion of the conductive connectors 114 of the die 110 and at least a portion of the conductive connectors 124 of the die 120 are accessibly revealed. The thinning process may include a grinding process, a chemical mechanical polishing (CMP) process, and/or a planarization process, or other suitable removing process. A cleaning step is optionally performed after thinning to clean and remove the residues generated from the thinning process. After reducing the thickness of the insulating material, the encapsulant 130 is formed. However, the formation of the encapsulant 130 may be performed through any other suitable techniques, the disclosure is not intended to limit to the above description. In some embodiments, during the thinning process, the protection layer 116 and/or the conductive connectors 114 of the die 110 and the protection layer 126 and/or the conductive connectors 124 of the die 120 may be slightly removed and planarized. The conductive connectors 114 of the die 110 and the conductive connectors 124 of the die 120 may be accessibly revealed by the protection layer 116 and 126, respectively. The protection layer 116 of the die 110 may at least laterally cover the conductive connectors 114. Similarly, the protection layer 126 of the die 120 may at least laterally cover the conductive connectors 124. In some embodiments, after forming the encapsulant 130, the surface 130a of the encapsulant 130 may be substantially coplanar with the front surface 110a of the die 110 and the front surface 120a of the die 120.

Figure 1B:
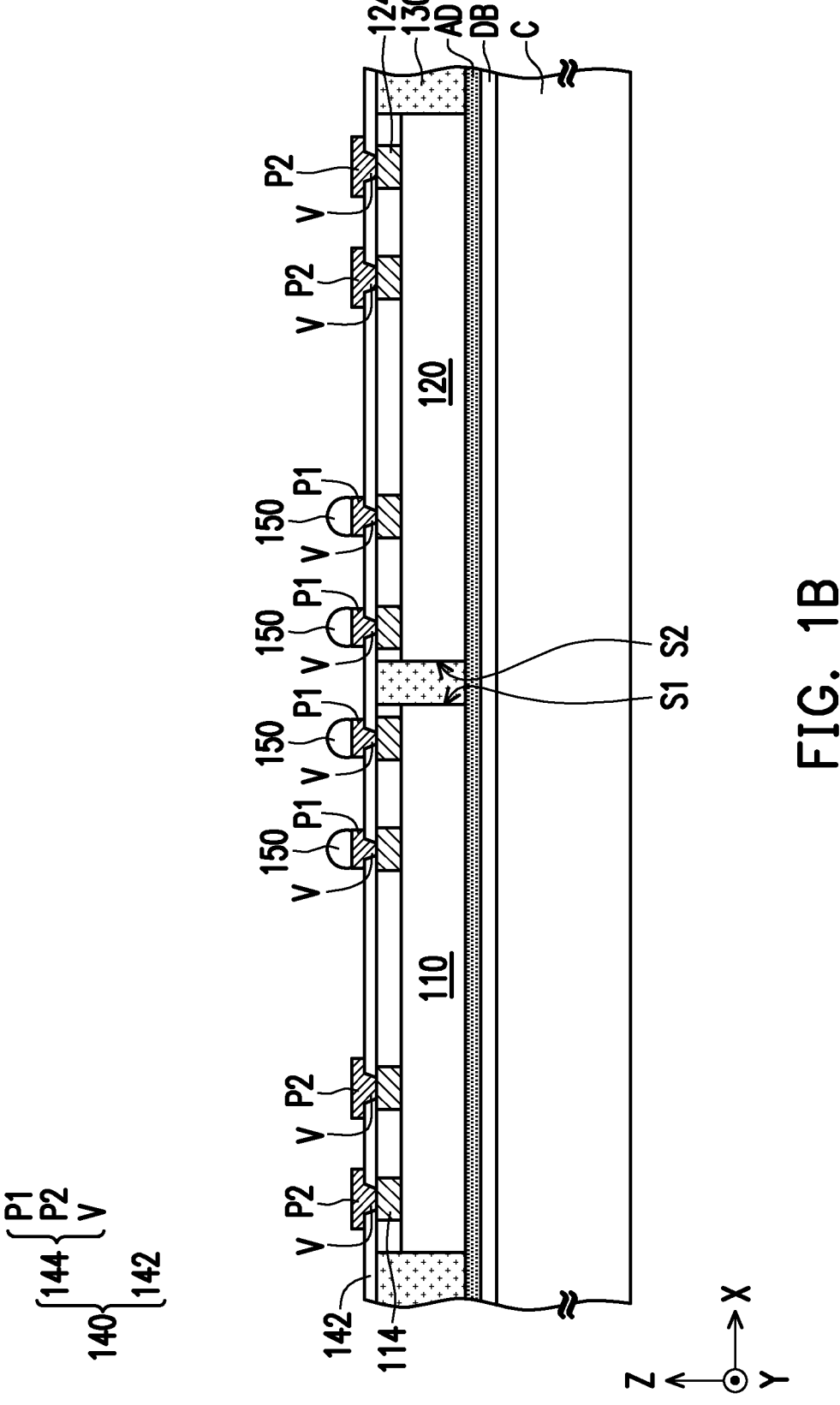

Referring to FIG. 1B, a redistribution structure 140 is formed on the surface 130a of the encapsulant 130, the front surface 110a of the die 110 and the front surface 120a of the die 120. The redistribution structure 140 includes, for example, a patterned dielectric layer 142 and a patterned conductive layer 144 in the patterned dielectric layer 142. In some embodiments, the method of forming the redistribution structure 140 includes at least the following steps. A dielectric material (e.g., polybenzoxazole, polyimide, benzocyclobutene, or other suitable material that is electrically insulating) is formed over the surface 130a of the encapsulant 130, the front surface 110a of the die 110, and the front surface 120a of the die 120 by using a spin-on process, a deposition process, or other suitable process. Next, a portion of the dielectric material is removed to form the patterned dielectric layer 142 having a plurality of openings by lithography and etching or other suitable removing process. The openings of the patterned dielectric layer 142 expose at least a portion of the conductive connectors 114 of the die 110 and at least a portion of the conductive connectors 124 of the die 120. Subsequently, a conductive material (e.g., a metal or a metal alloy such as copper, silver, gold, tungsten, cobalt, aluminum, or alloys thereof) is formed over the surface of the patterned dielectric layer 142 and fills in the openings of the patterned dielectric layer 142, and then the conductive material is patterned to form the patterned conductive layer 144 through patterning and metallization techniques (e.g., deposition of seed layer, lithography, plating, etching, etc.). Other suitable techniques may be utilized to form the redistribution structure 140.

As shown in FIG. 1B, the patterned conductive layer 144 includes a plurality of first conductive patterns P1 and a plurality of second conductive patterns P2, and each of the first conductive patterns P1 and the second conductive patterns P2 laterally extends over the top surface of the patterned dielectric layer 142 along a direction X. In some embodiments, the first conductive patterns P1 and the second conductive patterns P2 include conductive pads, conductive lines, conductive vias, and/or the like. Further, as shown in FIG. 1B, the first conductive patterns P1 are near to the side surface S1 of the die 110 facing towards the die 120 and the side surface S2 of the die 120 facing towards the die 110 than the second conductive patterns P2. In some embodiments, the first conductive patterns P1 and the second conductive patterns P2 are referred to as under-bump metallurgy (UBM) patterns for further electrical connection. For example, the first conductive patterns P1 are configured to electrically connect with the overlying die (e.g., die 160 in FIG. 1C), while the second conductive patterns P2 are configured to electrically connect with the conductive terminals (e.g., conductive terminals 192 in FIG. 1H).

Still referring to FIG. 1B, the patterned conductive layer 144 includes a plurality of conductive vias V, and each of the conductive vias V extends vertically through the patterned dielectric layer 142 along a direction Z perpendicular to the direction X to be in physical and electrical contact with the conductive connectors 114 of the die 110 and the conductive connectors 124 of the die 120. As such, each of the conductive vias V establishes electrical connections between the first conductive patterns P1 and the die 110, between the first conductive patterns P1 and the die 120, between the second conductive patterns P2 and the die 110, and between the second conductive patterns P2 and the die 120. It should be noted that although one layer of the patterned dielectric layer 142 and one layer of the patterned conductive layer 144 are illustrated in FIG. 1B, the number of these layers is not limited in the disclosure. In some alternative embodiments, the redistribution structure 140 may be constituted by more layers of the patterned dielectric layer 142 and the patterned conductive layer 144 depending on the design.

Continued referring to FIG. 1B, after the redistribution structure 140 is formed, a plurality of bonding elements 150 are formed on the first conductive patterns P1 with a one-to-one correspondence. In some embodiments, the bonding elements 150 are formed by: forming a layer of solder on the first conductive patterns P1 through evaporation, electroplating, printing, solder transfer, ball placement, and/or the like; and performing a reflow process to shape the solder material into the desired bump shapes. In some embodiments, the bonding elements 150 may be (or include) micro bumps. The bonding elements 150 are electrically connected with the redistribution structure 140 through the first conductive patterns P1. In some embodiments, the diameter of the bonding element 150 is in a range of about 5 μm to about 50 μm.

Figure 1C:
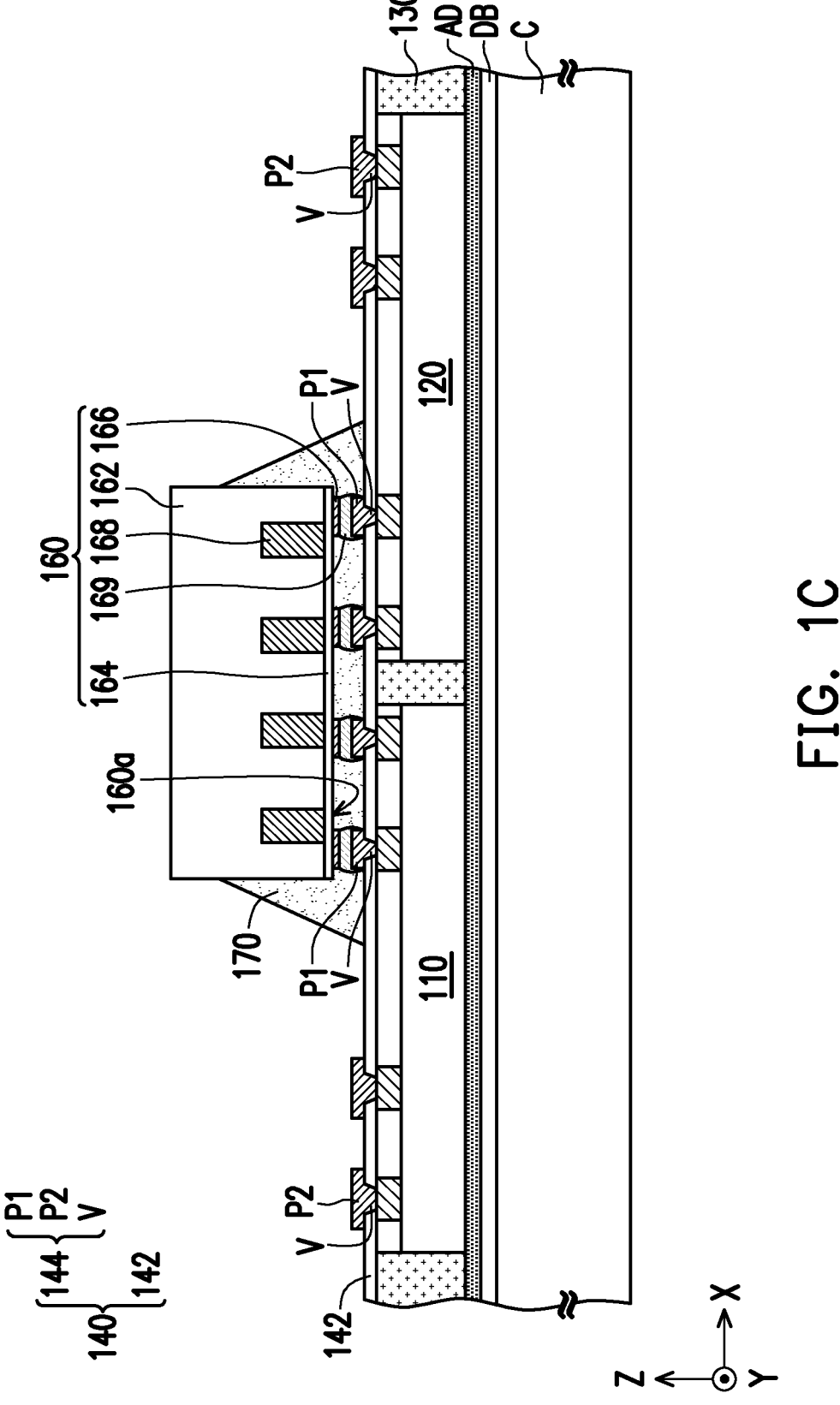

Referring to FIG. 1C, a die 160 is disposed over the surface 140a of the redistribution structure 140. For example, the die 160 is picked and placed on the redistribution structure 140. In detail, as shown in FIG. 1C, the die 160 extends over the gap between the die 110 and die 120. The die 160 may be the same type or the different type of semiconductor die with respective to the die 110 or the die 120. In some embodiments, the die 160 includes a semiconductor substrate 162, a device layer 164 disposed on the semiconductor substrate 162, and conductive connectors 166 connected to the device layer 164. In some embodiments, the die 160 includes through semiconductor vias (TSVs) 168. The TSVs 168 penetrate through the semiconductor substrate 162 so as to be in electrical contact with the device layer 164. The device layer 164 may include a wide variety of IC devices formed on the semiconductor substrate 162. The surface where the conductive connectors 166 are distributed may be referred to as a front surface 160a (e.g., active surface) of the die 160. In some embodiments, the die 160 is a bridge die (e.g., a silicon bridge die) for providing a shorter electrical connection path between the die 110 and the die 120. In some embodiments, the die 160 includes an interconnecting structure and free of active and/or passive device(s). In some alternative embodiments, the die 160 includes an interconnecting structure, active devices, and optionally, passive devices.

The die 160 may be disposed in a flip-chip manner. For example, after disposing the die 160 over the redistribution structure 140, a reflow process may be performed to mount the die 160 on the redistribution structure 140. In detail, as shown in FIG. 1B and FIG. 1C, the reflow process reflows the bonding elements 150, and then the bonding elements 150 become conductive joints 169 (e.g., solder joints) to connect and bond the conductive connectors 166 with the first conductive patterns P1 of the patterned conductive layer 144. As such, the front surface 160a of the die 160 faces toward the front surface 110a of the die 110 and the front surface 120a of the die 120. After bonding the die 160 onto the first conductive patterns P1 of the patterned conductive layer 144, the die 110 and the die 120 are electrically connected by the die 160 through the patterned conductive layer 144, the solder joints 169, the conductive connectors 166 and the device layer 164.

In some embodiments, as shown in FIG. 1C, the conductive joint 169 substantially covers the entirety of the illustrated bottom surface of the conductive connector 166, and substantially also covers the entireties of the surface (illustrated as the top surface in FIG. 1C) and the sidewall of the first conductive pattern P1 which is protruded from the patterned dielectric layer 142. However, the disclosure is not limited thereto. In some alternative embodiments, the conductive joint 169 may partially cover the illustrated bottom surface of the conductive connector 166, the conductive joint 169 may partially cover the illustrated top surface of the first conductive pattern P1, and/or the conductive joint 169 may partially cover the sidewall of the first conductive pattern P1. Further, although the die 160 is bonded with the redistribution structure 140 through the conductive joints 169 originated from the bonding elements 150 on the first conductive patterns P1 during the reflow process, the disclosure is not limited thereto. In some alternative embodiments, before bonding the die 160 and the redistribution structure 140, the bonding elements are formed on the conductive connector 166 of the die 160, while the bonding elements 150 are not formed; or the bonding elements are formed on the conductive connector 166 of the die 160, while the bonding elements 150 are also formed.

Continued on FIG. 1C, after the die 160 is connected and bonded with the redistribution structure 140, an underfill layer 170 is formed between the die 160 and the redistribution structure 140, and surrounding the conductive joints 169 and the die 160. In some embodiments, when a sufficient amount of the underfill material is formed, a portion of the underfill layer 170 may climb up to cover the side surfaces of the die 160 to provide a degree of protection, as shown in FIG. 1C. The underfill layer 170 may improve the adhesion between the die 160 and the redistribution structure 140 and may provide a stress relief to prevent the conductive joints 169 from cracking. The underfill layer 170 may be formed by a capillary flow process after the die 160 is attached, or may be formed by a suitable deposition method before the die 160 is attached. In some embodiments, the underfill layer 170 includes polymer such as epoxy.

Figure 1D:
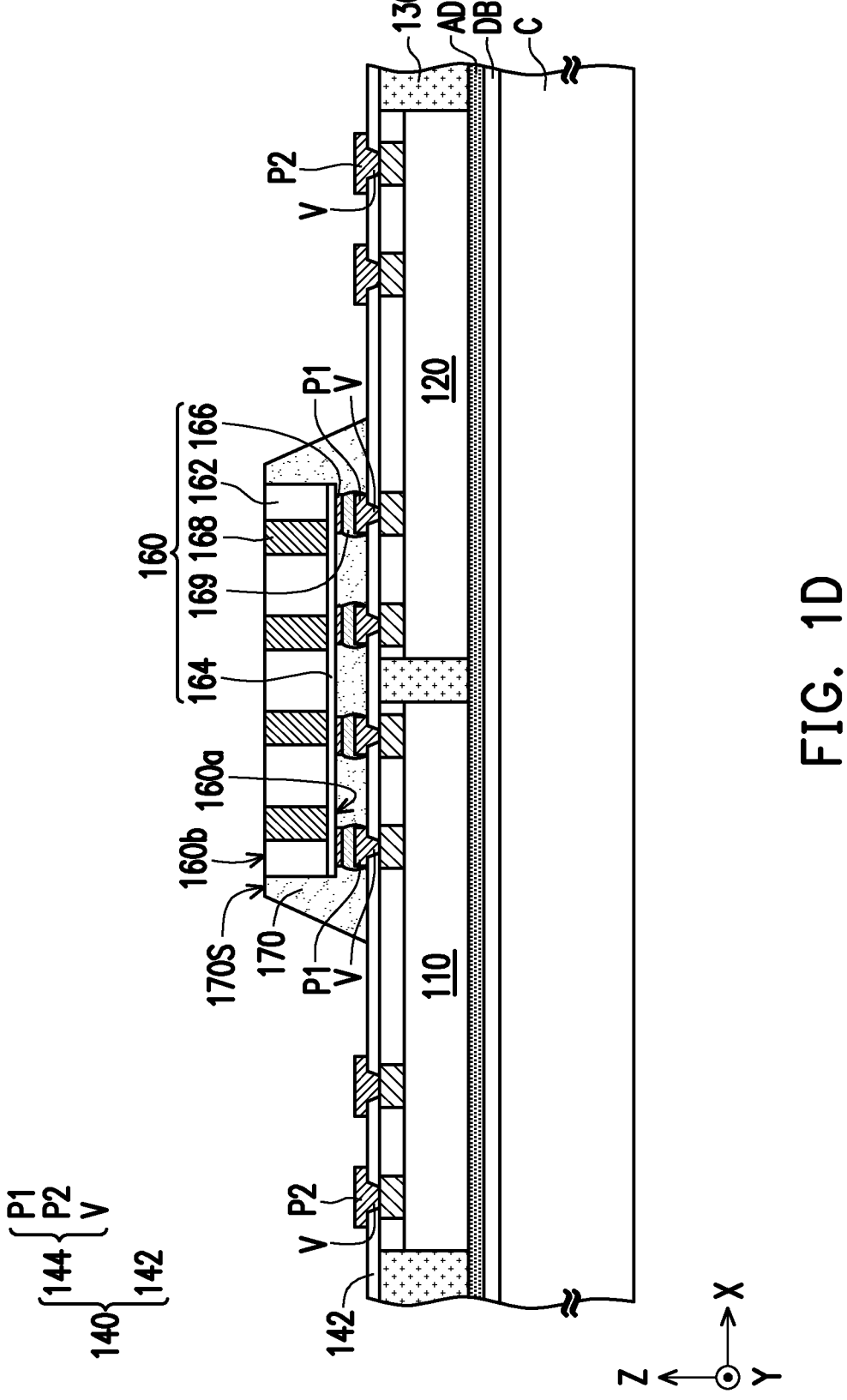

Referring to FIG. 1D, a thinning process is performed to thin the die 160. In detail, as shown in FIG. 1D, the thinning process is performed on a back surface 160b opposite to the front surface 160a, such that the die 160 is thinned until the TSVs 168 are exposed. The TSVs 168 of the die 160 may be accessibly revealed by the semiconductor substrate 162. In some embodiments, during the thinning process, the TSVs 168 may be slightly removed and planarized. Further, as the underfill layer 170 covers the side surfaces of the die 160, during the thinning process, the underfill layer 170 is partially removed along with the die 160. In some embodiments, as shown in FIG. 1D, after the thinning process is performed, the back surface 160b of the die 160 and the surface 170S (illustrated as the top surface in FIG. 1D) of the underfill layer 170 are substantially flush and coplanar with each other. That is to say, after the thinning process is performed, a plane surface constituted by the back surface 160b of the die 160 and the surface 170S of the underfill layer 170 is formed over the redistribution structure 140. Further, after the thinning process is performed, the die 160 is laterally covered and encapsulated by the underfill layer 170. In detail, as shown in FIG. 1D, after the thinning process is performed, the underfill layer 170 substantially covers the entireties of the side surfaces of the die 160. In some embodiments, the thinning process performed on the die 160 includes a grinding process, a CMP process, and/or a planarization process, or other suitable removing process.

After the die 160 is thinned down, a patterned dielectric layer 180 is formed on back surface 160b of the die 160. The formation of the patterned dielectric layer 180 will be discussed in further detail below in conjunction with FIG. 1E to FIG. 1G.

Figure 1E:
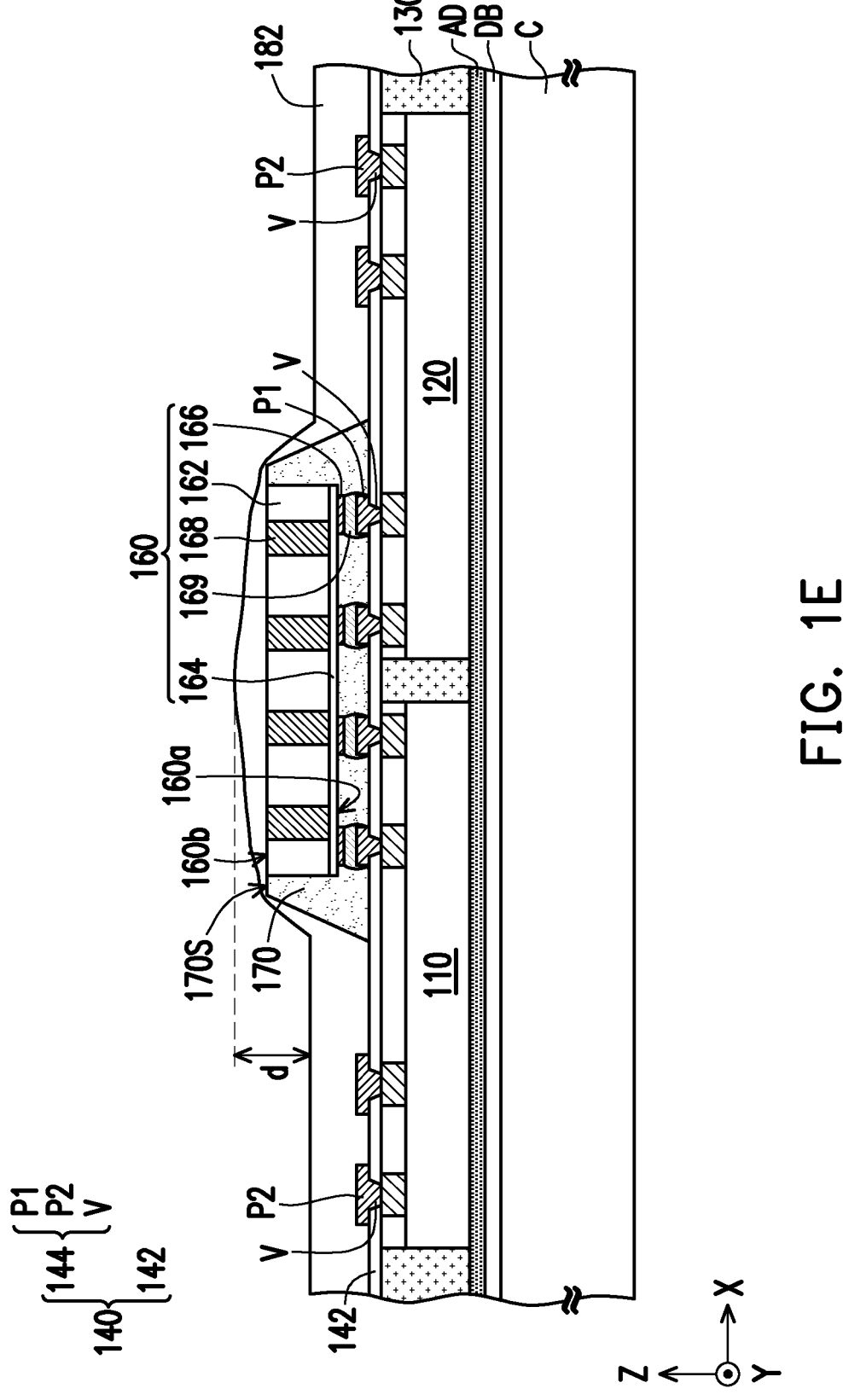

Referring to FIG. 1E, a dielectric layer 182 is formed on the redistribution structure 140, the underfill layer 170 and the die 160. In detail, the dielectric layer 182 is conformally formed with the underlying redistribution structure 140, underfill layer 170 and die 160. As such, as shown in FIG. 1E, the illustrated top surface of the dielectric layer 182 is not planar. In other words, the illustrated top surface of the dielectric layer 182 is an uneven surface. From another point of view, as shown in FIG. 1E, a portion of the dielectric layer 182 that is disposed in the region that out of the die 160 and the underfill layer 170 is lower than another portion of the dielectric layer 182 that is disposed in the region that the die 160 and the underfill layer 170 are located in. That is to say, the illustrated top surface of the dielectric layer 182 has variation in height. In some embodiments, a height difference d along the direction Z between a highest point and a lowest point of the illustrated top surface of the dielectric layer 182 ranges from about 27 μm to about 54 μm, wherein the highest point is at the portion of the dielectric layer 182 that is disposed in the region that the die 160 and the underfill layer 170 are located in, and the lowest point is at the portion of the dielectric layer 182 that is disposed in the region that out of the die 160 and the underfill layer 170. Further, as shown in FIG. 1E, since the underfill layer 170 and the die 160 are formed over and protruded from the surface 140a of the redistribution structure 140, the topography variation of the illustrated top surface of the portion of the dielectric layer 182 that is disposed in the region that out of the die 160 and the underfill layer 170 is less than the topography variation of the illustrated top surface of the portion of the dielectric layer 182 that is disposed in the region that the die 160 and the underfill layer 170 are located in.

In some embodiments, the formation of the dielectric layer 182 includes at least the following steps. First, a dielectric material is conformally formed over the redistribution structure 140, the underfill layer 170 and the die 160 by spin-coating, CVD, physical vapor deposition (PVD), or the like. Subsequently, a baking process is performed on the dielectric material to form the dielectric layer 182. The baking process is a low temperature baking process. For example, the baking temperature of the baking process ranges from about 90° C. to less than about 160° C. In some embodiments, the baking temperature of the baking process is about 110° C. In some embodiments, the material of the dielectric layer 182 includes a photosensitive material, such as polyimide, PBO, or BCB.

Figure 1F:
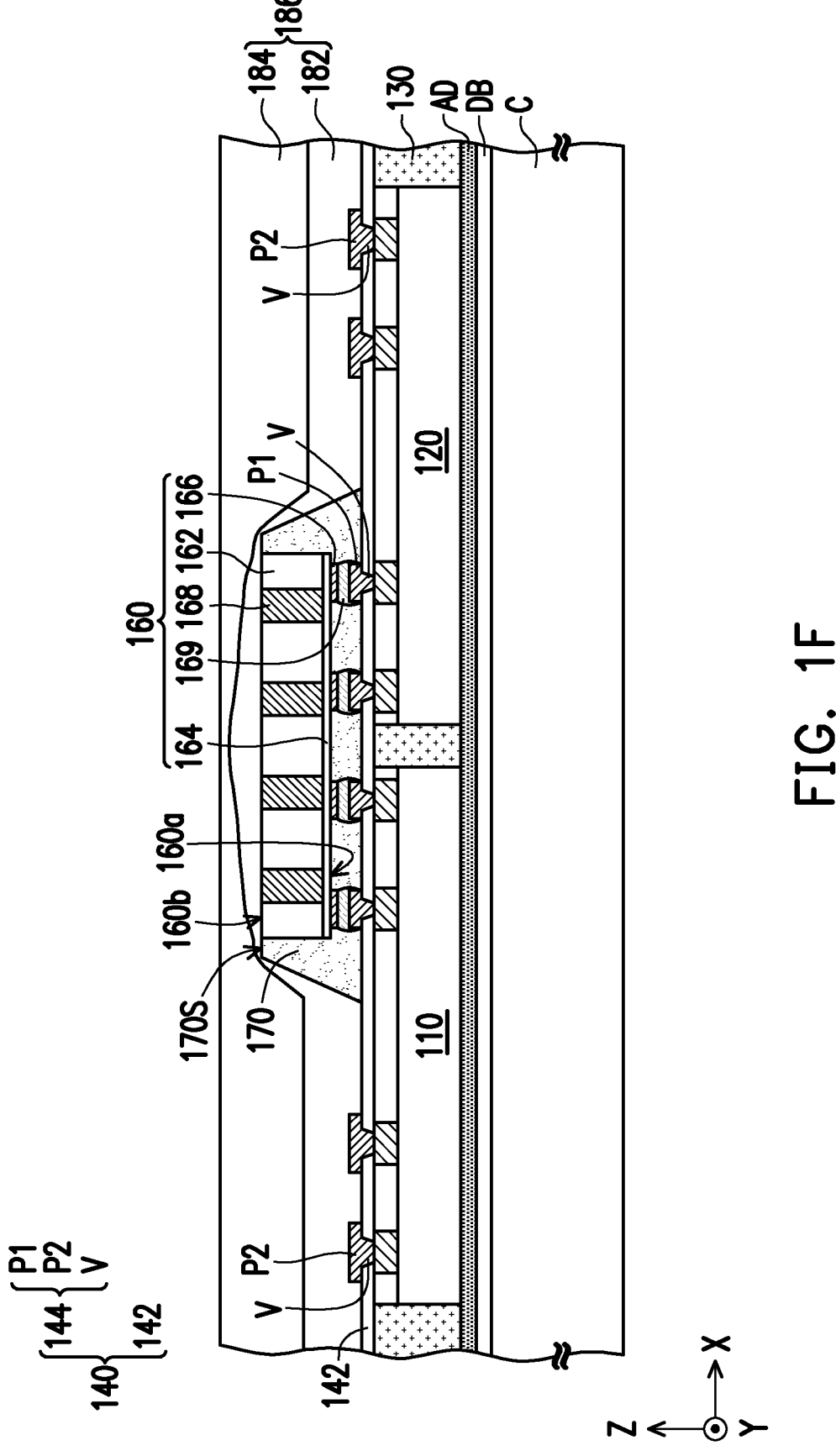

Referring to FIG. 1F, a dielectric layer 184 is formed on the dielectric layer 182. In detail, the dielectric layer 184 is conformally formed with the underlying dielectric layer 182 so as to have a substantially planar surface (illustrated as the top surface in FIG. 1F), as shown in FIG. 1F. That is to say, by sequentially conformally forming the dielectric layer 182 and the dielectric layer 184 over the redistribution structure 140, the underfill layer 170 and the die 160, the dielectric layer 184 is rendered with the substantially planar and flat surface. From another point of view, after the dielectric layer 184 is formed, a composite dielectric layer 186 used to form the patterned dielectric layer 180 in subsequent step is formed with the substantially planar top surface. In other words, the composite dielectric layer 186 used to form the patterned dielectric layer 180 is constituted by two sublayers (i.e., the dielectric layer 182 and the dielectric layer 184). As shown in FIG. 1F, the composite dielectric layer 186 is formed over the surface 170S of the underfill layer 170 and the back surface 160b of the die 160, so that the entireties of the underfill layer 170 and the die 160 are encapsulated collectively by the composite dielectric layer 186.

Further, as shown in FIG. 1F, an illustrated top surface of a portion of the dielectric layer 184 that is disposed in the region that out of the die 160 and the underfill layer 170 is at substantially the same level as an illustrated top surface of another portion of the dielectric layer 184 that is disposed in the region that the die 160 and the underfill layer 170 are located in. Herein, when elements are described as "at substantially the same level", the elements are formed at substantially the same height. That is to say, the level height of the illustrated top surface of the portion of the dielectric layer 184 that is disposed in the region that out of the die 160 and the underfill layer 170 is substantially equal to the level height of the illustrated top surface of another portion of the dielectric layer 184 that is disposed in the region that the die 160 and the underfill layer 170 are located in. However, the disclosure is not limited thereto. In some alternative embodiments, there is a slight height difference (to a neglectable degree during the subsequently formation of the patterned dielectric layer 180) along the direction Z between the illustrated top surface of the portion of the dielectric layer 184 that is disposed in the region that out of the die 160 and the underfill layer 170 and the illustrated top surface of another portion of the dielectric layer 184 that is disposed in the region that the die 160 and the underfill layer 170 are located in. That is to say, the level height of the illustrated top surface of the portion of the dielectric layer 184 that is disposed in the region that out of the die 160 and the underfill layer 170 is slightly different from the level height of the illustrated top surface of another portion of the dielectric layer 184 that is disposed in the region that the die 160 and the underfill layer 170 are located in. In some embodiments, the said slight height difference along the direction Z ranges from greater than 0 μm to about 10 μm. It is noted that since the level height of the illustrated top surface of the portion of the dielectric layer 184 that is disposed in the region that out of the die 160 and the underfill layer 170 is substantially equal to or slightly different from the level height of the illustrated top surface of another portion of the dielectric layer 184 that is disposed in the region that the die 160 and the underfill layer 170 are located in, the top surface of the dielectric layer 184 or the composite dielectric layer 186 is considered to be substantially planar or flat surface.

In some embodiments, the formation of the dielectric layer 184 includes at least the following steps. First, a dielectric material is conformally formed over the dielectric layer 182 by spin-coating, CVD, PVD, or the like. Subsequently, a baking process is performed on the dielectric material to form the dielectric layer 184. The baking process is a soft baking process. For example, the baking temperature of the baking process ranges from about 110° C. to about 350° C. In some embodiments, the baking temperature of the baking process is about 230° C. In some embodiments, the baking temperature of the baking process for forming the dielectric layer 184 is greater than the baking temperature of the baking process for forming the dielectric layer 182. In some embodiments, the material of the dielectric layer 184 includes a photosensitive material, such as polyimide, PBO, or BCB. In some embodiments, the material of the dielectric layer 184 is the same as the material of the dielectric layer 182. In some embodiments, the material of the dielectric layer 184 is different from the material of the dielectric layer 182. It is noted that by performing twice dielectric material formation processes (e.g., coating processes) and twice baking processes to form the composite dielectric layer 186, well-controlled and better surface flatness of the composite dielectric layer 186 is achievable.

Figure 1G:
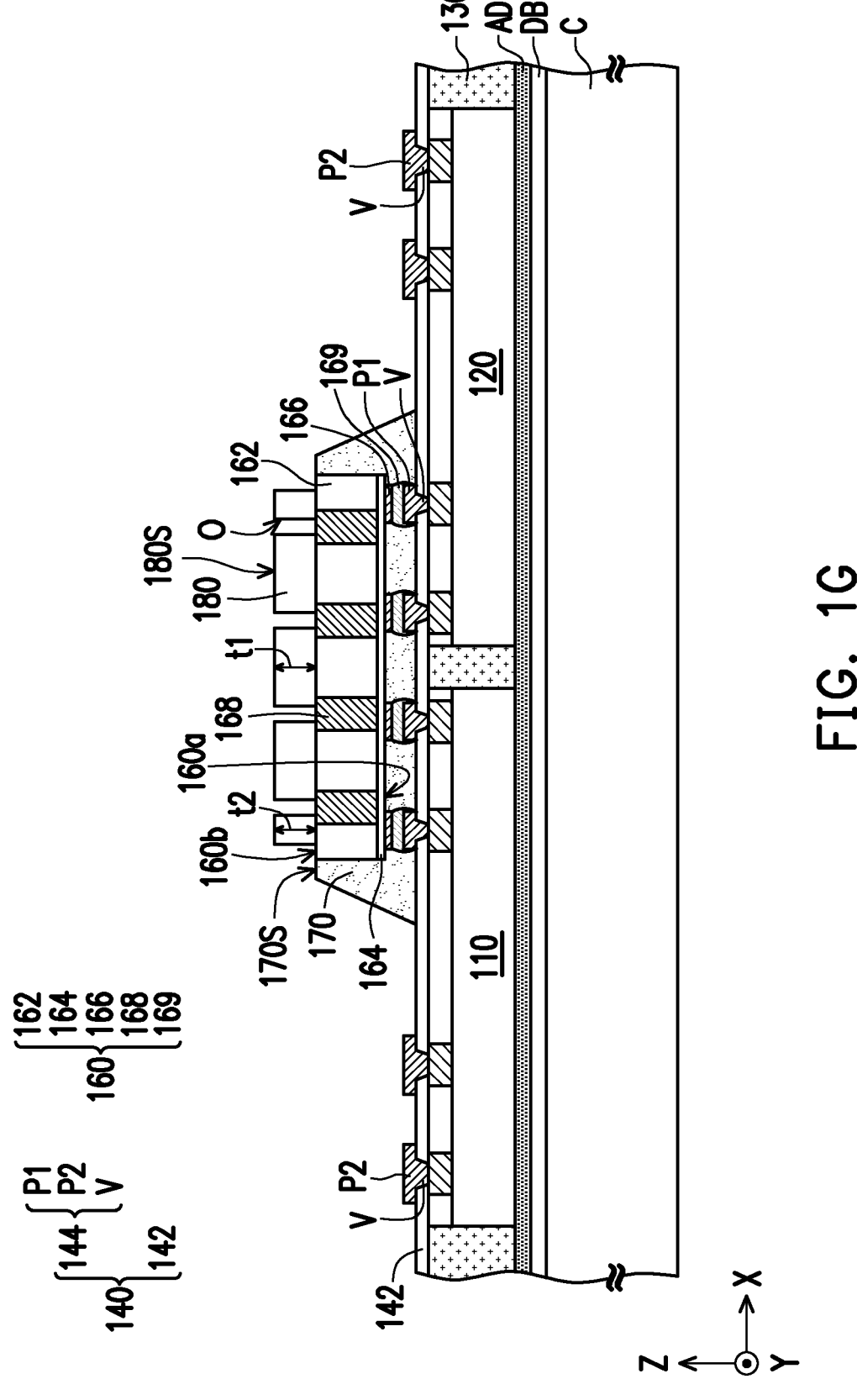

Referring to FIG. 1G, the composite dielectric layer 186 is partially removed to form the patterned dielectric layer 180. As shown in FIG. 1G, the patterned dielectric layer 180 is formed to be located directly above the die 160. In detail, as shown in FIG. 1G and the schematic top view of FIG. 2A, along the direction Z, the vertical projection of the patterned dielectric layer 180 onto the temporary carrier C is located within the span of the vertical projection of the die 160 onto the temporary carrier C. That is to say, the side surfaces of the patterned dielectric layer 180 all overlap with the die 160 along the direction Z. In other words, a dimension d1 along the direction X and a dimension d3 along a direction Y perpendicular to the direction X of the patterned dielectric layer 180 are both smaller than a dimension d5 along the direction X and a dimension d6 along a direction Y of the die 160. As such, distances (e.g., distances x1, x2, y1 and y2) may exist between the side surfaces of the patterned dielectric layer 180 and the side surfaces of the die 160. In some embodiments, as shown in FIG. 2A, the distance x1 is the same as the distance x2, and the distance y1 is the same as the distance y2. In other words, the patterned dielectric layer 180 is formed at the center of the die 160. However, the disclosure is not limited thereto. In some alternative embodiments, the distance x1 is different from the distance x2, and/or the distance y1 is different from the distance y2. In certain embodiments, as shown in FIG. 2B, the distance x1 is greater than the distance x2, and the distance y1 is greater than the distance y2. From another point of view, as shown in FIG. 2A, the side surface of the patterned dielectric layer 180 is parallel with the corresponding side surface of the die 160. That is, no included angle is between the side surface of the patterned dielectric layer 180 and the corresponding side surface of the die 160. However, the disclosure is not limited thereto. In some alternative embodiments, the side surface of the patterned dielectric layer 180 is not parallel with the corresponding side surface of the die 160. In certain embodiments, as shown in FIG. 2C, the included angle θ1 is between the side surface of the patterned dielectric layer 180 and the corresponding side surface of the die 160, and the included angle θ1 is greater than 0 degree and less than about 90 degrees. Still referring to FIG. 1G and FIG. 2A, the patterned dielectric layer 180 is formed to have a plurality of openings O exposing the underlying TSVs 165 of the die 160. That is, the openings O in the patterned dielectric layer 180 are formed directly above the TSVs 165 of the die 160.

In some embodiments, the patterned dielectric layer 180 is formed by performing a lithography patterning process on the composite dielectric layer 186. In some embodiments, the lithography patterning process on the composite dielectric layer 186 includes at least the following steps. First, an exposure process is performed to expose the composite dielectric layer 186 to a radiation source to transfer a pattern from a photomask to the composite dielectric layer 186. For example, the radiation source is an ultraviolet light (UV) source (e.g., a deep UV light source, an extreme UV light (EUV) source, and/or the like), an x-ray source, an electron beam (e-beam) source, and/or the like. Next, a development process is performed on the composite dielectric layer 186 that has been exposed to the radiation source to develop the pattern transferred to the composite dielectric layer 186 during the exposure process. In some embodiments, the development process is performed to develop the pattern by removing unexposed portions of the composite dielectric layer 186. In some embodiments, the development process is performed to develop the pattern by removing exposed portions of the composite dielectric layer 186. In some embodiments, the development process is performed to develop the pattern by dissolving exposed or unexposed portions of the composite dielectric layer 186 through the use of a chemical developer. Afterwards, a post develop baking (PDB) process is performed on the composite dielectric layer 186 that has been developed to form the patterned dielectric layer 180 with the openings O. For example, the baking temperature of the post develop baking process ranges from about 110° C. to about 170° C. In some embodiments, the baking temperature of the post develop baking process is about 140° C. However, the disclosure is not limited thereto. In some alternative embodiments, the lithography patterning process on the composite dielectric layer 186 may include performing other processes, such as post-exposure baking process, rinsing process, drying process (for example, hard baking process). Further, alternatively, the exposure process is assisted, implemented, or replaced by other methods, such as maskless lithography, electron-beam writing, or ion-beam writing.

Further, since, as mentioned above, the composite dielectric layer 186 is formed with the substantially planar top surface, the patterned dielectric layer 180 originated from the composite dielectric layer 186 is also formed to have a surface 180S (illustrated as the top surface in FIG. 1G) with a substantially planar profile. In detail, as shown in FIG. 1G, in the patterned dielectric layer 180, the surface 180S is a substantially planar surface, and the thickness t1 at center is substantially equal to the thickness t2 at an edge. In some embodiments, a total thickness variation (TTV) of the patterned dielectric layer 180 is greater than or equal to 0 μm, and less than about 1 μm. It is noted that since the TTV of the patterned dielectric layer 180 is greater than or equal to 0 μm, and less than about 1 μm, the surface 180S of the patterned dielectric layer 180 is considered to be substantially planar or flat surface.

From another point of view, as shown in FIG. 1G, a portion of the surface 180S of the patterned dielectric layer 180 that is located on the TSV 165 is parallel with the back surface 160b of the die 160. That is, no included angle is between the portion of the surface 180S of the patterned dielectric layer 180 that is located on the TSV 165 and the back surface 160b of the die 160. However, the disclosure is not limited thereto. In some alternative embodiments, the portion of the surface 180S of the patterned dielectric layer 180 that is located on the TSV 165 is not parallel with the back surface 160b of the die 160, and is slightly inclined with respect to the back surface 160b of the die 160. In certain embodiments, the included angle (not shown) between the portion of the surface 180S of the patterned dielectric layer 180 that is located on the TSV 165 and the back surface 160b of the die 160 is greater than 0 degree and equal to or less than about 10 degrees. It is noted that since the portion of the surface 180S of the patterned dielectric layer 180 that is located on the TSV 165 is parallel with or slightly inclined with respect to the back surface 160b of the die 160, the said portion of the surface 180S of the patterned dielectric layer 180 is considered to be substantially planar or flat, and be substantially parallel with the back surface 160b of the die 160. Further, it is noted that the substantially planar and flat surface 180S of the patterned dielectric layer 180 provides a better platform to accommodate elements (e.g., conductive terminals 190 in FIG. 1H) formed in subsequent step. That is, a high degree of flatness of the surface 180S of the patterned dielectric layer 180 is provided, the formation of the later-formed elements is beneficial.

Figure 1H:
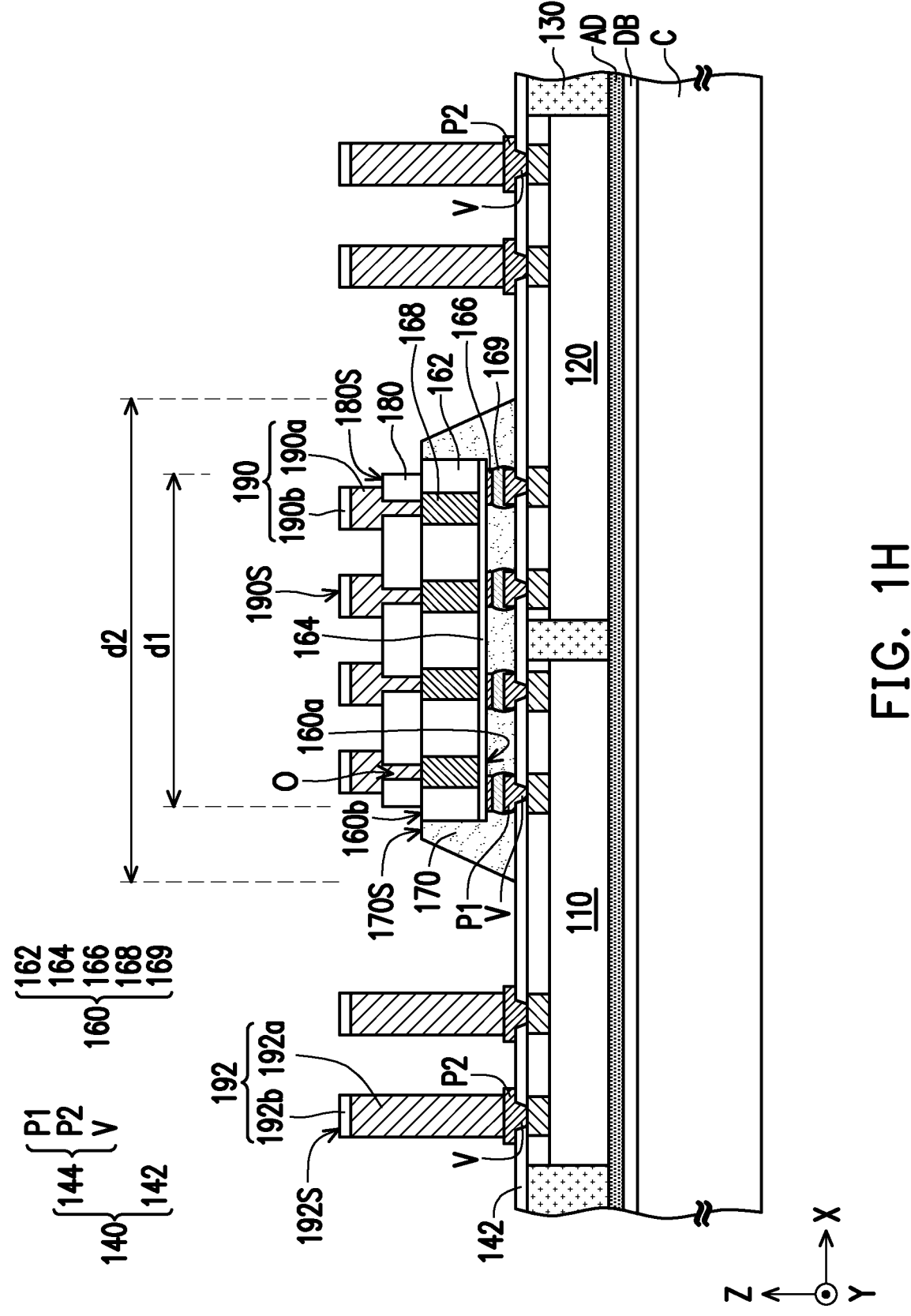

Referring to FIG. 1H, after the patterned dielectric layer 180 is formed, a plurality of conductive terminals 190 are formed on the patterned dielectric layer 180 and inside the openings O of the patterned dielectric layer 180 to be in physical and electrical contact with the TIVs 165 of the die 160, and a plurality of conductive terminals 192 are formed on and in physical contact with the second conductive patterns P2 to electrically connect with the redistribution structure 140. The conductive terminals 190 are electrically coupled to the redistribution structure 140 through the die 160. In some embodiments, the conductive terminals 190 and 192 are controlled collapse chip connection (C4) bumps.

In some embodiments, the conductive terminal 190 includes a first portion 190a and a second portion 190b disposed on the first portion 190a, and the conductive terminal 192 includes a first portion 192a and a second portion 192b disposed on the first portion 190a. As shown in FIG. 1H, the first portion 190a is formed on the TIVs 165 of the die 160, the second portion 190b is formed on the first portion 190a, the first portion 192a is formed on the second conductive patterns P2 of the redistribution structure 140, and the second portion 192b is formed on the first portion 192a. In some embodiments, as shown in FIG. 1H, a surface 190S (illustrated as the top surface in FIG. 1H) of the conductive terminal 190 is at substantially the same level as a surface 192S (illustrated as the top surface in FIG. 1H) of the conductive terminal 192, such that the conductive terminals 190 and the conductive terminals 192 may have good coplanarity for the subsequently bonding process. In other words, the level height of the surface 190S is substantially equal to the level height of the surface 192S. However, the disclosure is not limited thereto. In some alternative embodiments, there is a slight height difference (to a neglectable degree during the subsequently bonding process) along the direction Z between the surface 190S and the surface 192S. That is to say, the level height of the surface 190S is slightly different from the level height of the surface 192S. In some embodiments, as shown in FIG. 1H, the first portion 190a of the conductive terminal 190 may include a conductive via formed in the opening O, and a conductive pattern formed on the conductive via and laterally extending over the surface 180S of the patterned dielectric layer 180 along the direction X. In some embodiments, the first portion 190a and the second portion 190b are made of different materials, and the first portion 192a and the second portion 192b are made of different materials. In some embodiments, the first portion 190a and the first portion 192a are made of same material, and the second portion 190b and the second portion 192b are made of same material.

In some embodiments, the method of forming the conductive terminals 190 and the conductive terminals 192 includes the following steps. First, a seed layer (not shown) is blanketly formed over the temporary carrier C. The seed layer may be a Ti/Cu bilayer, a copper layer, or other suitable metal layer, and may be deposited using any suitable deposition technique such as PVD, e.g., sputtering, evaporation, etc. Next, a photoresist layer with openings (not shown) is formed on the seed layer, and the openings of the photoresist layer are formed for the intended locations of the conductive terminals 190. That is, the openings of the photoresist layer for forming the conductive terminals 190 expose the openings O of the patterned dielectric layer 180. In some embodiments, the openings for the subsequently formed conductive terminals 190 are formed through a photolithography process. Subsequently, a plating process is performed to form a conductive material layer for the first portions 190a and a conductive material layer for the second portions 190b on the seed layer exposed by the openings of the photoresist layer. In some embodiments, the plating process may be an electroplating process or an electroless plating process, or the like. In some embodiments, the material of the conductive material layer for the first portions 190a includes pure elemental copper, copper containing unavoidable impurities, or copper alloys containing minor amounts of elements such as tantalum, indium, tin, zinc, titanium, germanium, platinum, aluminum, and the conductive material layer for the second portions 190b includes solder material including alloys of tin, lead, silver, copper, nickel, bismuth, or combinations thereof. Subsequently, the photoresist layer with openings for the conductive terminals 190 is removed by a suitable removal process such as ashing, stripping, or the like. Next, another photoresist layer with openings (not shown) is formed on the seed layer, and the openings of the photoresist layer are formed for the intended locations of the conductive terminals 192. That is, the openings of the photoresist layer for forming the conductive terminals 192 expose the second conductive patterns P2 of the redistribution structure 140. In some embodiments, the openings for the subsequently formed conductive terminals 192 are formed through a photolithography process. Subsequently, another plating process is performed to form a conductive material layer for the first portions 192a and a conductive material layer for the second portions 192b on the seed layer exposed by the openings for forming the conductive terminals 192. In some embodiments, the plating process may be an electroplating process or an electroless plating process, or the like. In some embodiments, the material of the conductive material layer for the first portions 192a includes pure elemental copper, copper containing unavoidable impurities, or copper alloys containing minor amounts of elements such as tantalum, indium, tin, zinc, titanium, germanium, platinum, aluminum, and the conductive material layer for the second portions 192b includes solder material including alloys of tin, lead, silver, copper, nickel, bismuth, or combinations thereof. Subsequently, the photoresist layer with openings for the conductive terminals 192 is removed by a suitable removal process such as ashing, stripping, or the like. After the removal of the photoresist layer for the conductive terminals 192, portions of the seed layer that are not covered by the conductive material layer for the first portions 190a, the conductive material layer for the second portions 190b, the conductive material layer for the first portions 192a and the conductive material layer for the second portions 192b may be removed by any suitable process (e.g., wet etching, dry etching, or the like), and the said conductive material layers may serve as an etch mask during the removal process of the seed layer. Then, the conductive material layer for the first portions 190a and the underlying remaining seed layer constitute the first portions 190a, the conductive material layer for the first portions 192a and the underlying remaining seed layer constitute the first portions 192a, the conductive material layer for the second portions 190b becomes the second portions 190b on the first portions 190a, and the conductive material layer for the second portions 192b becomes the second portions 192b on the first portions 192a. Since the seed layer is not removed yet after the formation of the conductive material layer for the first portions 190a and the conductive material layer for the second portions 190b, the plating process of the conductive material layer for the first portions 192a and the conductive material layer for the second portions 192b shares the same seed layer with the plating process of the conductive material layer for the first portions 190a and the conductive material layer for the second portions 190b. That is, the seed layer blanketly formed over the temporary carrier C may be utilized for plating for the conductive terminals 190 and the conductive terminals 192. However, the disclosure is not limited thereto. In some alternative embodiments, the plating process for the conductive terminals 192 is performed before the plating process for the conductive terminals 190. Further, in some embodiments, after the second portions 190b are formed on the first portions 190a, and the second portions 192b are formed on the first portions 192a, a reflow process is performed to reshape the second portions 190b and the second portions 192b.

It is noted that since the patterned dielectric layer 180 is formed with a high degree of flatness surface 180S, a better platform for forming the conductive terminals 190 is provided. In detail, as mentioned above, since the portion of the surface 180S of the patterned dielectric layer 180 that is located on the TSV 165 is parallel with or slightly inclined with respect to the back surface 160b of the die 160, each of the conductive terminals 190 that formed on the TSV 165 in the opening O and in contact with the portion of the surface 180S of the patterned dielectric layer 180 that is located on the TSV 165 is formed with a better TTV. Thereby, the resulted semiconductor package 10 has better yield and reliability. In some embodiments, a TTV of the conductive via of the first portion 190a of the conductive terminal 190 is greater than or equal to 0 and less than about 1 μm; and a TTV of the conductive pattern of the first portion 190a of the conductive terminal 190 is greater than or equal to 0 and less than about 1 μm. Further, since the conductive terminals 190 are formed on a platform with a high degree of flatness (i.e., the substantially planar surface 180S of the patterned dielectric layer 180), the keep out zone (KOZ) from the edge of the patterned dielectric layer 180 to the outermost conductive terminal 190 can be accordingly reduced. Thereby, the resulted semiconductor package 10 has larger layout design feasibility for customer.

Figure 1I:
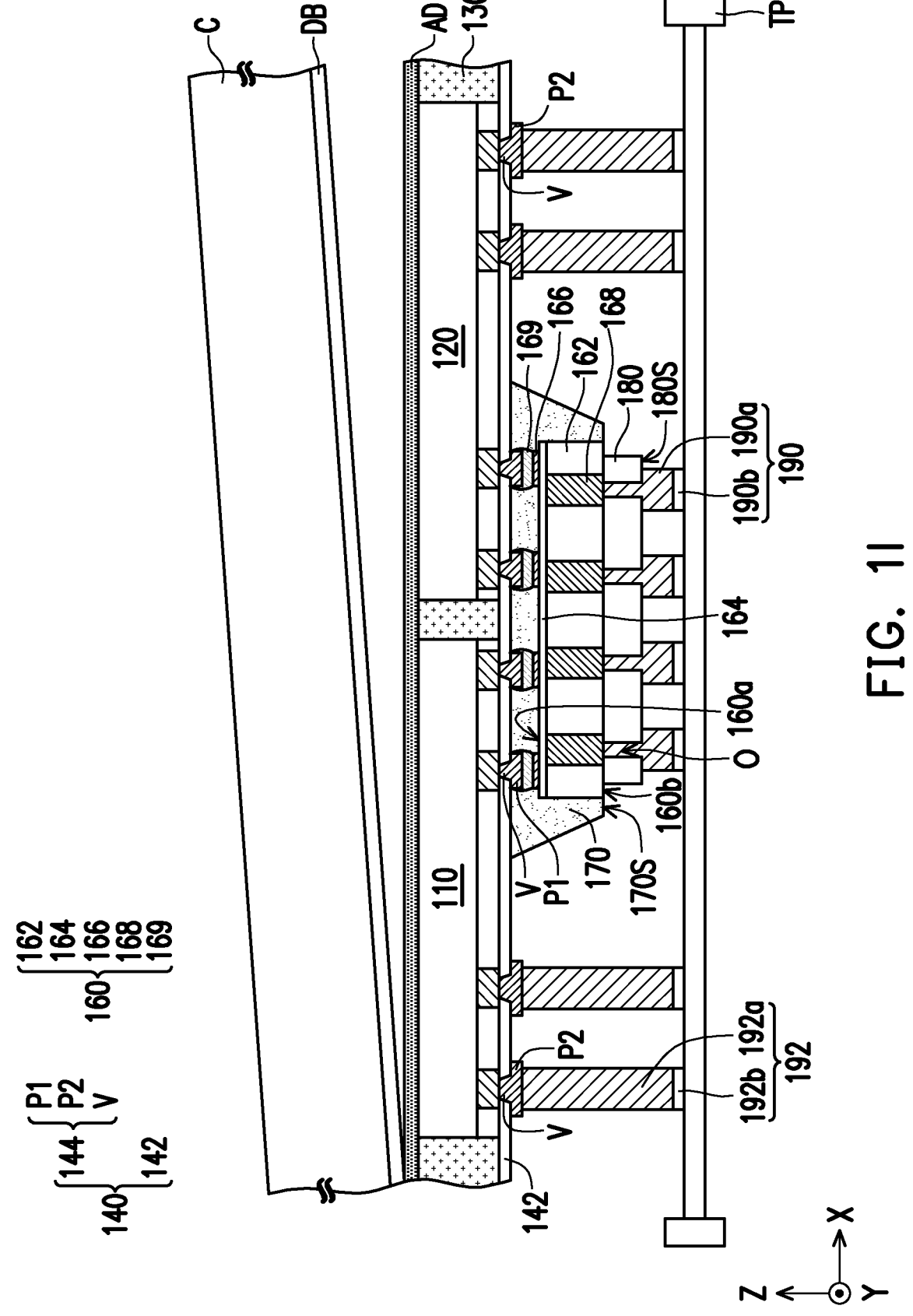
Figure 1J:
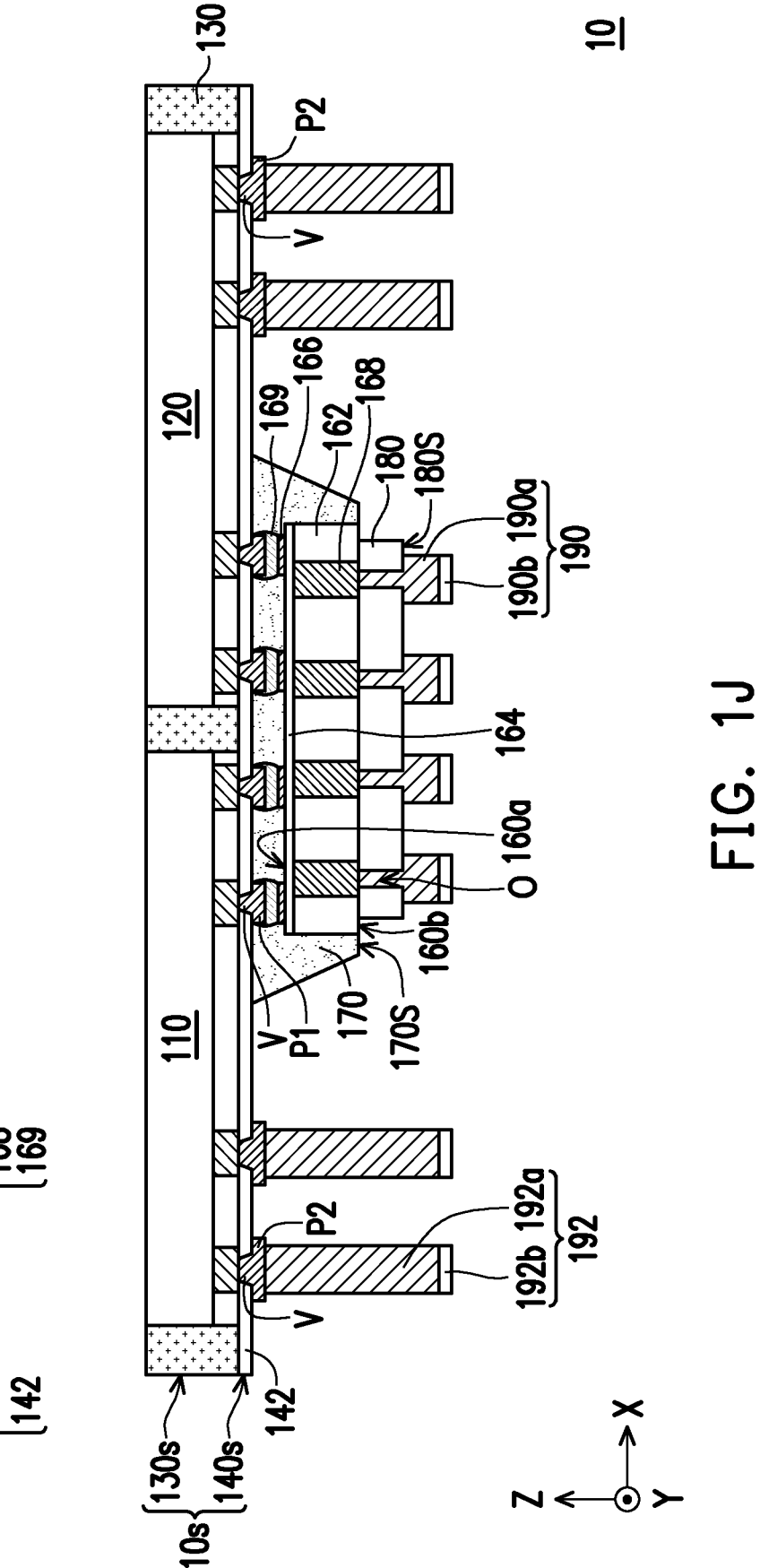

Referring to FIG. 1I and FIG. 1J, after forming the conductive terminals 190 and the conductive terminals 192, the structure shown in FIG. 1H is placed on a holder TP, and the temporary carrier TC is detached and removed. For example, the structure shown in FIG. 1H is overturned (e.g., turned upside down) to be placed on the holder TP, and then the de-bonding process of the temporary carrier TC is performed. For example, the de-bonding layer DB (e.g., the LTHC release layer) is irradiated with a UV laser so that the temporary carrier TC and the de-bonding layer DB can be peeled off from the underlying structure. Nevertheless, the de-bonding process of the temporary carrier TC is not limited thereto. In some embodiments, after removing the temporary carrier TC and the de-bonding layer DB, the adhesive layer AD (e.g., DAF) is left on the structure. In such embodiments, an additional removal process may be performed to remove the adhesive layer AD, and a cleaning step is optionally performed on the surface of the structure after the removal of the adhesive layer AD. In alternative embodiments, the adhesive layer AD is removed along with the de-bonding layer DB and the temporary carrier TC.

In some embodiments, the structure shown in FIG. 1I is singulated or separated at singulation lines (not shown) for forming individual and separated semiconductor packages 10 as illustrated in FIG. 1J. Although one singulated semiconductor package 10 is shown in FIG. 1J, those skilled in the art should understand that plural semiconductor packages 10 are obtained after the singulation process. In detail, the encapsulant 130 and the redistribution structure 140 are cut through to form singulated semiconductor package 10 having a coterminous sidewall 10s, where the coterminous sidewall 10s includes the sidewall 130s of the encapsulant 130 and the redistribution structure 140s of the redistribution structure 140 substantially leveled with each other. In some embodiments, the aforementioned steps are performed at wafer level, and the singulation process may involve performing a wafer dicing process. For example, the dicing or singulation process is a laser cutting process, a mechanical cutting process, or other suitable process. To perform the singulation process, the holder TP may be applied to the conductive terminals 190 and the conductive terminals 192 as shown in FIG. 1I. The holder TP may be a dicing tape that may support the structure during the singulation process. Alternatively, after forming the conductive terminals 190 and the conductive terminals 192, the singulation process may be performed to dice the structure illustrated in FIG. 1H along the singulation lines, and then the singulated structures are placed on the holder TP for subsequent processes.

In the manufacturing method of the semiconductor package 10 shown in FIG. 1A to FIG. 1J, the patterned dielectric layer 180 with the substantially planar surface 180S is formed from the composite dielectric layer 186 constituted by the dielectric layer 182 and the dielectric layer 184 and formed by performing twice dielectric material formation processes and twice baking processes. However, the disclosure is not limited thereto. In some alternative embodiments, the patterned dielectric layer 180 with the substantially planar surface 180S is formed from a single dielectric layer. Hereinafter, other embodiments will be described with reference to FIG. 3.

Figure 3:
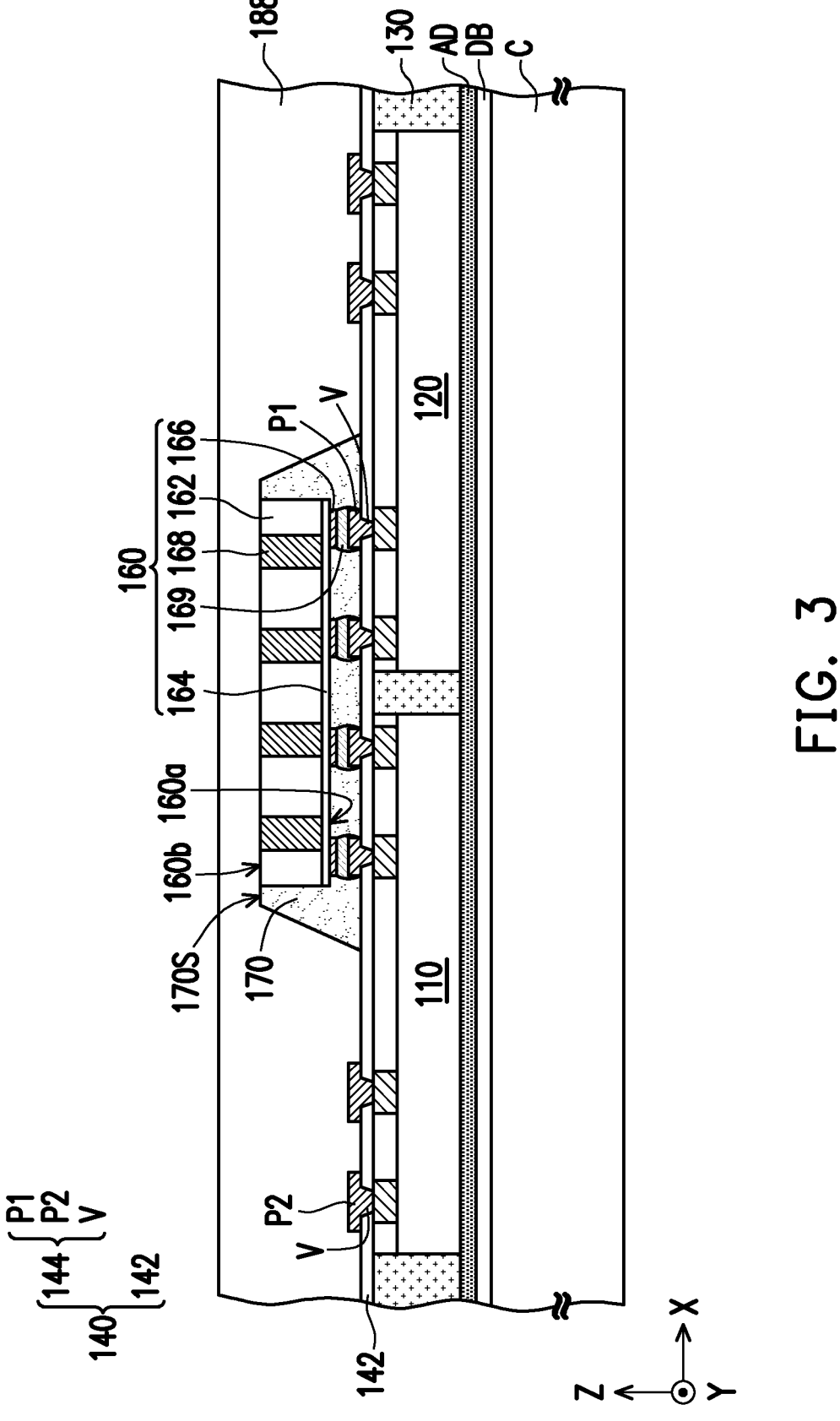
FIG. 3 is a schematic cross-sectional view of a stage of manufacturing the semiconductor package of FIG. 1J in accordance with some alternative embodiments of the disclosure.

FIG. 3 is a schematic cross-sectional view of a stage of manufacturing the semiconductor package 10 of FIG. 1J in accordance with some alternative embodiments of the disclosure. The elements similar to or substantially the same as the elements described previously will use the same reference numbers, and certain details or descriptions (e.g., the materials, formation processes, positioning configurations, etc.) of the same or similar elements would not be repeated herein, and differences between the embodiments with reference to FIG. 3 and the embodiments described previously will be described below.

Referring to FIG. 3, a structure same as the structure of FIG. 1D is provided. Details or descriptions (e.g., the materials, formation processes, positioning configurations, etc.) of the temporary carrier C, the de-bonding layer DB, the adhesive layer AD, the dies 110 and 120, the encapsulant 130, the redistribution structure 140, the die 160, the conductive joints 169 and the underfill layer 170 have been described in conjunction with FIGS. 1A-1D above, and will not be iterated herein again. Accordingly, for details or descriptions of the temporary carrier C, the de-bonding layer DB, the adhesive layer AD, the dies 110 and 120, the encapsulant 130, the redistribution structure 140, the die 160, the conductive joints 169 and the underfill layer 170 not iterated herein, please refer to the aforesaid embodiments.

Continued on FIG. 3, a dielectric layer 188 is formed on the redistribution structure 140, the underfill layer 170 and the die 160. In detail, as shown in FIG. 3, the dielectric layer 188 is formed over the surface 170S of the underfill layer 170 and the back surface 160b of the die 160, so that the entireties of the underfill layer 170 and the die 160 are encapsulated collectively by the dielectric layer 188. From another point of view, the dielectric layer 188 is formed non-conformally on the underlying redistribution structure 140, underfill layer 170 and die 160. As such, as shown in FIG. 3, the dielectric layer 188 is formed to have a substantially planar surface (illustrated as the top surface in FIG. 3) without affecting by the underlying uneven topography. In some embodiments, the dielectric layer 188 is referred to as a non-conformal dielectric layer.

Further, as shown in FIG. 3, an illustrated top surface of a portion of the dielectric layer 188 that is disposed in the region that out of the die 160 and the underfill layer 170 is at substantially the same level as an illustrated top surface of another portion of the dielectric layer 188 that is disposed in the region that the die 160 and the underfill layer 170 are located in. That is to say, the level height of the illustrated top surface of the portion of the dielectric layer 188 that is disposed in the region that out of the die 160 and the underfill layer 170 is substantially equal to the level height of the illustrated top surface of another portion of the dielectric layer 188 that is disposed in the region that the die 160 and the underfill layer 170 are located in. However, the disclosure is not limited thereto. In some alternative embodiments, there is a slight height difference (to a neglectable degree during the subsequently formation of the patterned dielectric layer 180) along the direction Z between the illustrated top surface of the portion of the dielectric layer 188 that is disposed in the region that out of the die 160 and the underfill layer 170 and the illustrated top surface of another portion of the dielectric layer 188 that is disposed in the region that the die 160 and the underfill layer 170 are located in. That is to say, the level height of the illustrated top surface of the portion of the dielectric layer 188 that is disposed in the region that out of the die 160 and the underfill layer 170 is slightly different from the level height of the illustrated top surface of another portion of the dielectric layer 188 that is disposed in the region that the die 160 and the underfill layer 170 are located in. In some embodiments, the said slight height difference along the direction Z ranges from greater than 0 μm to about 20 μm. It is noted that since the level height of the illustrated top surface of the portion of the dielectric layer 188 that is disposed in the region that out of the die 160 and the underfill layer 170 is substantially equal to or slightly different from the level height of the illustrated top surface of another portion of the dielectric layer 188 that is disposed in the region that the die 160 and the underfill layer 170 are located in, the illustrated top surface of the dielectric layer 188 is considered to be substantially planar or flat surface.

In some embodiments, the formation of the dielectric layer 188 includes at least the following steps. First, a dielectric material is formed non-conformally over the redistribution structure 140, the underfill layer 170 and the die 160 by spin-coating, CVD, PVD, or the like. Subsequently, a baking process is performed on the dielectric material to form the dielectric layer 188. The baking process is a soft baking process. For example, the baking temperature of the baking process ranges from about _70_° C. to about _140_° C. In some embodiments, the baking temperature of the baking process is about _110_° C. In some embodiments, the material of the dielectric layer 188 includes a non-conformal dielectric material. In some embodiments, the non-conformal dielectric material includes epoxy-based material, polyimide, or acrylate. It is noted that by using a non-conformal dielectric material to form the dielectric layer 188, well-controlled and better surface flatness of the dielectric layer 188 is achievable. Referring to both FIG. 3 and FIG. 1G, after the dielectric layer 188 is formed, the dielectric layer 188 is partially removed to form the patterned dielectric layer 180.

Figure 4:
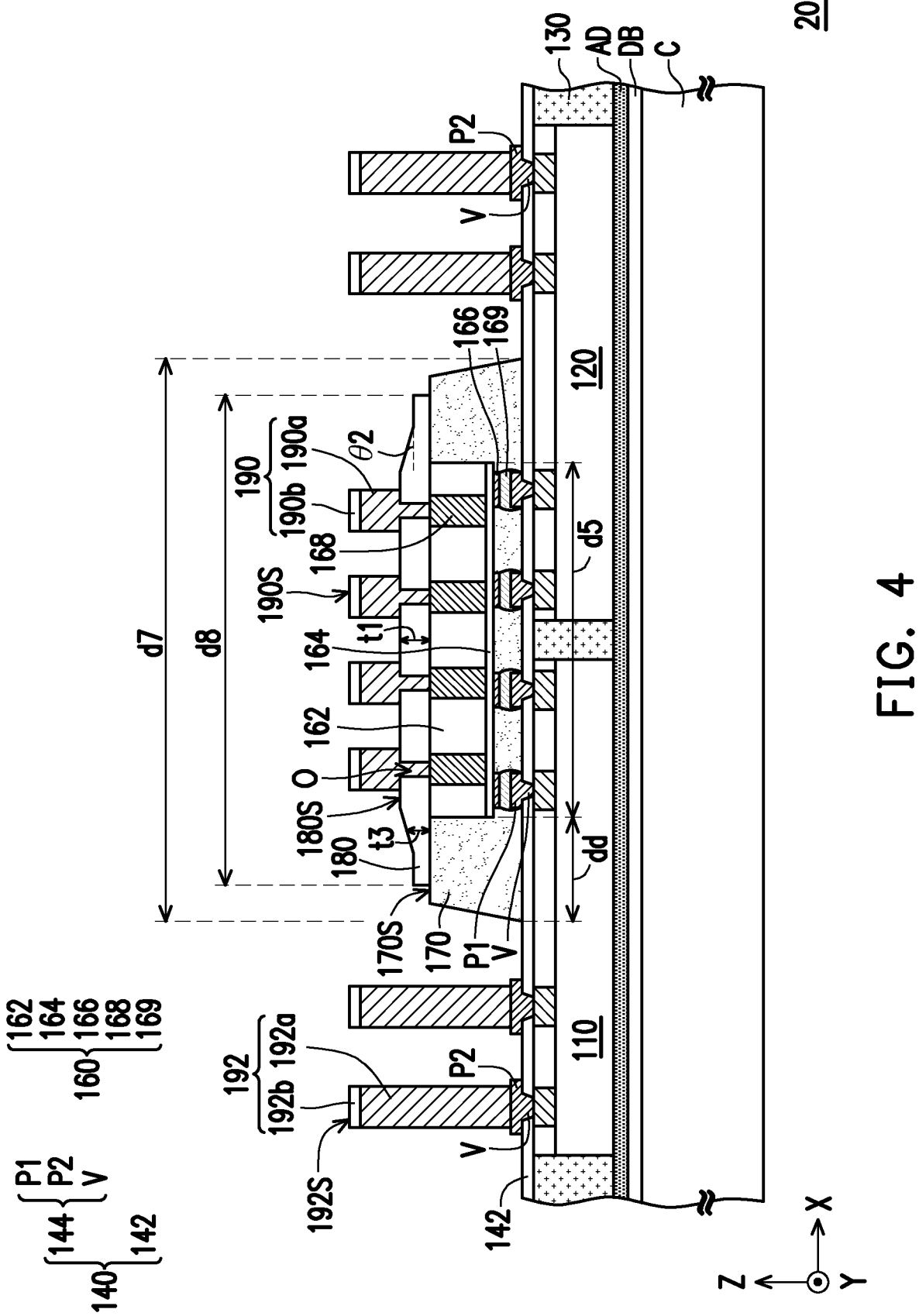
FIG. 4 is a schematic cross-sectional view illustrating a semiconductor package in accordance with some alternative embodiments of the disclosure.
Figure 5:
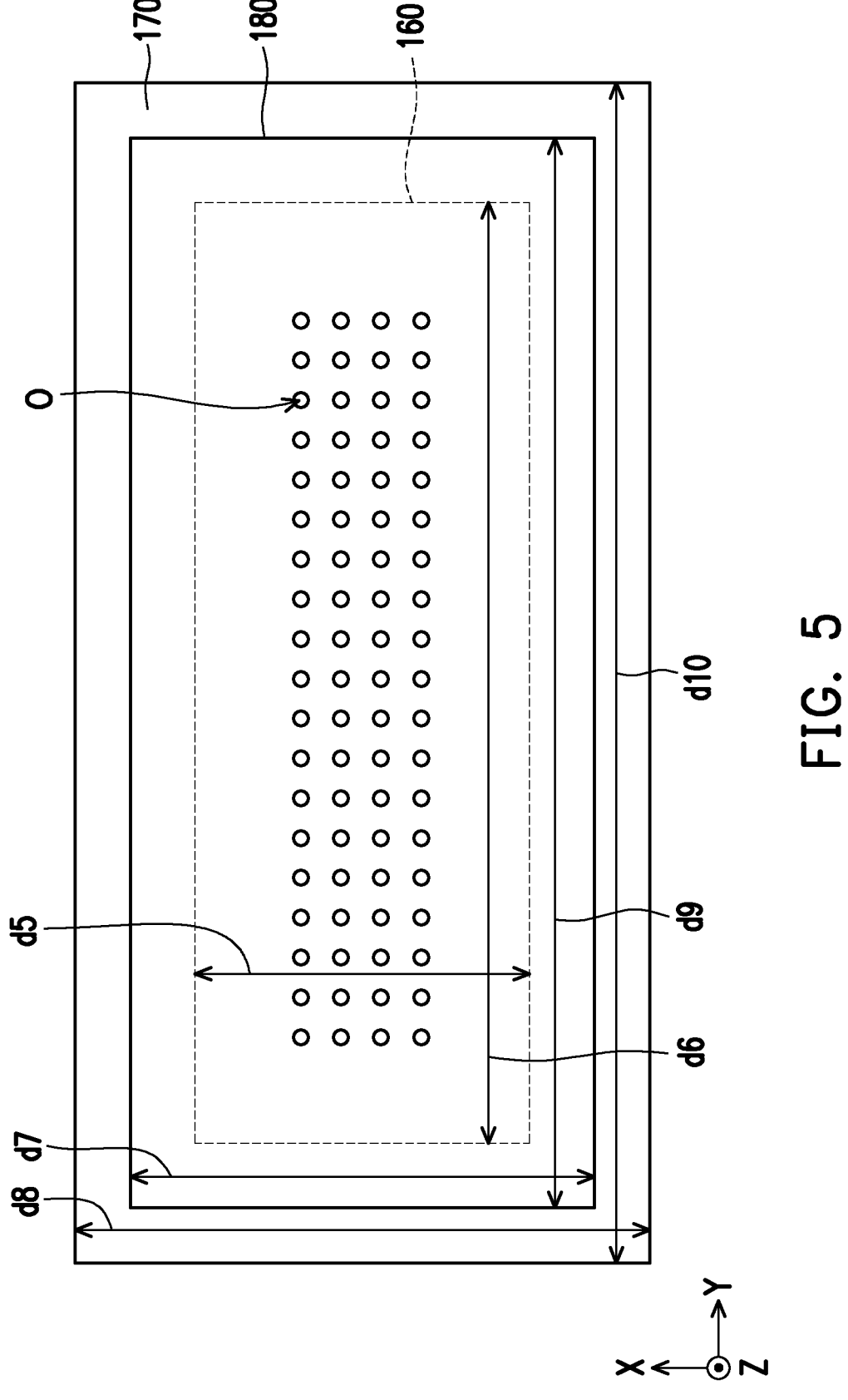
FIG. 5 is a schematic top view illustrating a portion of the semiconductor package of FIG. 4 in accordance with some embodiments of the disclosure.

FIG. 4 is a schematic cross-sectional view illustrating a semiconductor package 20 in accordance with some alternative embodiments of the disclosure. FIG. 5 is a schematic top view illustrating a portion of the semiconductor package of FIG. 4 in accordance with some embodiments of the disclosure. The semiconductor package 20 illustrated in FIG. 4 is similar to the semiconductor package 10 illustrated in FIG. 1J, hence the same reference numerals are used to refer to the same or liked parts, and its detailed description will be omitted herein. The main differences between the semiconductor package 20 and the semiconductor package 10 lie in that: the size of the patterned dielectric layer 180 in the semiconductor package 20 is greater than the size of the patterned dielectric layer 180 in the semiconductor package 10, and the size of the underfill layer 170 in the semiconductor package 20 is greater than the size of the underfill layer 170 in the semiconductor package 10. In detail, as shown in FIG. 1J, FIG. 2A, FIG. 4 and FIG. 5, along the direction X, the dimension d5 of the patterned dielectric layer 180 in the semiconductor package 20 is greater than the dimension d1 of the patterned dielectric layer 180 in the semiconductor package 10, and the dimension d6 of the underfill layer 170 in the semiconductor package 20 is greater than the dimension d2 of the underfill layer 170 in the semiconductor package 10; and along the direction Y, the dimension d7 of the patterned dielectric layer 180 in the semiconductor package 20 is greater than the dimension d3 of the patterned dielectric layer 180 in the semiconductor package 10, and the dimension d8 of the underfill layer 170 in the semiconductor package 20 is greater than the dimension d4 of the underfill layer 170 in the semiconductor package 10. In some embodiments, according to the descriptions with respect to FIGS. 1C-1D, those skilled in the art should understand that the underfill layer 170 of the semiconductor package 20 with the increased size may be formed by increasing the amount of the underfill layer 170 during a capillary flow process or a deposition method.

Further, as shown in FIG. 4 and FIG. 5, in the semiconductor package 20, along the direction Z, the vertical projection of the die 160 onto the redistribution structure 140 is located within the span of the vertical projection of the patterned dielectric layer 180 onto the redistribution structure 140, and the vertical projection of the patterned dielectric layer 180 onto the redistribution structure 140 is located within the span of the vertical projection of the underfill layer 170 onto the redistribution structure 140. That is to say, in the semiconductor package 20, the side surfaces of the patterned dielectric layer 180 all overlap with the underfill layer 170 along the direction Z, and the patterned dielectric layer 180 extends from the die 160 toward the underfill layer 170 to cover the interface between the underfill layer 170 and the side surfaces of the die 160. In other words, in the semiconductor package 20, a dimension d7 along the direction X and a dimension d9 along the direction Y of the patterned dielectric layer 180 are both greater than a dimension d5 along the direction X and a dimension d6 along a direction Y of the die 160. It is noted that in the semiconductor package 20, by increasing the size (area) of the patterned dielectric layer 180 to cover the interface between the underfill layer 170 and the side surfaces of the die 160, the coverage of the seed layer used for forming the conductive terminals 190 and the conductive terminals 192 is improved, therefore a better TTV of each of the conductive terminals 190 and the conductive terminals 192 can be achieved. In some embodiments, in the semiconductor package 20, a TTV of the conductive via of the conductive terminal 190 is greater than or equal to 0 and less than about 5 μm; and a TTV of the conductive pattern of the conductive terminal 190 is greater than or equal to 0 and less than about 5 μm.

Further, as shown in FIG. 4, in the semiconductor package 20, the surface 180S of the patterned dielectric layer 180 is not planar. In other words, in the semiconductor package 20, the surface 180S of the patterned dielectric layer 180 is an uneven surface. In some embodiments, according to the descriptions with respect to FIG. 1E and FIG. 1G, those skilled in the art should understand that the patterned dielectric layer 180 of the semiconductor package 20 with the uneven surface 180S may be formed by conformally forming a dielectric material over the redistribution structure 140, the underfill layer 170 and the die 160 by spin-coating, CVD, PVD, or the like; performing a baking process with a low baking temperature, for example, ranging from about 90° C. to less than about 160° C.; and performing a lithography patterning process on the dielectric material that has been baked.

Further, as shown in FIG. 4, an edge portion of the surface 180S is inclined with respect to the back surface 160b of the die 160, while a portion of the surface 180S that is located on the TSV 165 and directly under the conductive pattern of the first portion 190a of each conductive terminal 190 is parallel with the back surface 160b of the die 160. In some embodiments, as shown in FIG. 4, the included angle θ2 between the edge portion of the surface 180S of the patterned dielectric layer 180 and the back surface 160b of the die 160 is equal to or greater than about 10 degrees and equal to or less than about 30 degrees. From another point of view, as shown in FIG. 4, the thickness t1 at center of the patterned dielectric layer 180 is different from a thickness t3 at an edge of the patterned dielectric layer 180. That is, a thickness of the patterned dielectric layer 180 varies throughout the patterned dielectric layer 180. In some embodiments, in the semiconductor package 20, a TTV of the patterned dielectric layer 180 is greater than or equal to 2 μm and less than or equal to about 20 μm. Further, according to the descriptions with respect to FIG. 1G, those skilled in the art should understand that the portion of the surface 180S of the patterned dielectric layer 180 that is located on the TSV 165 and under the conductive pattern of each conductive terminal 190 may be not parallel with the back surface 160b of the die 160, and be slightly inclined with respect to the back surface 160b of the die 160 to form an included angle (not shown) being greater than 0 degree and equal to or less than about 10 degrees. As such, it is noted that in the semiconductor package 20, even the patterned dielectric layer 180 is formed from the conformal dielectric material, the patterned dielectric layer 180 still provides a platform with a high degree of flatness for the conductive terminals 190, such that each conductive terminal 190 is formed with better TTV. Further, it is noted that in the semiconductor package 20, by increasing the size (area) of the underfill layer 170 to offer more space for accommodating the conformally formed dielectric material, well-controlled and better flatness of the surface 180S of the patterned dielectric layer 180 for accommodating the later-formed conductive terminals 190 with better TTVs is achievable. In some embodiments, a ratio of a minimum distance between the outer edge of the underfill layer 170 and the corresponding side surface of the die 160 to the dimension of the die 160 ranges from 0.05:1 to 0.5:1. In certain embodiments, as shown in FIG. 4, a ratio of a minimum distance dd along the direction X between the outer edge of the underfill layer 170 and the corresponding side surface of the die 160 to the dimension d5 along the direction X of the die 160 ranges from 0.1:1 to 0.4:1. It is noted that in the semiconductor package 20, by arranging a ratio of a minimum distance between the outer edge of the underfill layer 170 and the corresponding side surface of the die 160c (i.e., the side surface of the die 160c facing toward the outer edge of the underfill layer 170) to the dimension of the die 160 in the forgoing range, well-controlled and better flatness of the surface 180S of the patterned dielectric layer 180 for accommodating the later-formed conductive terminals 190 with better TTVs is achievable.

Figure 6:
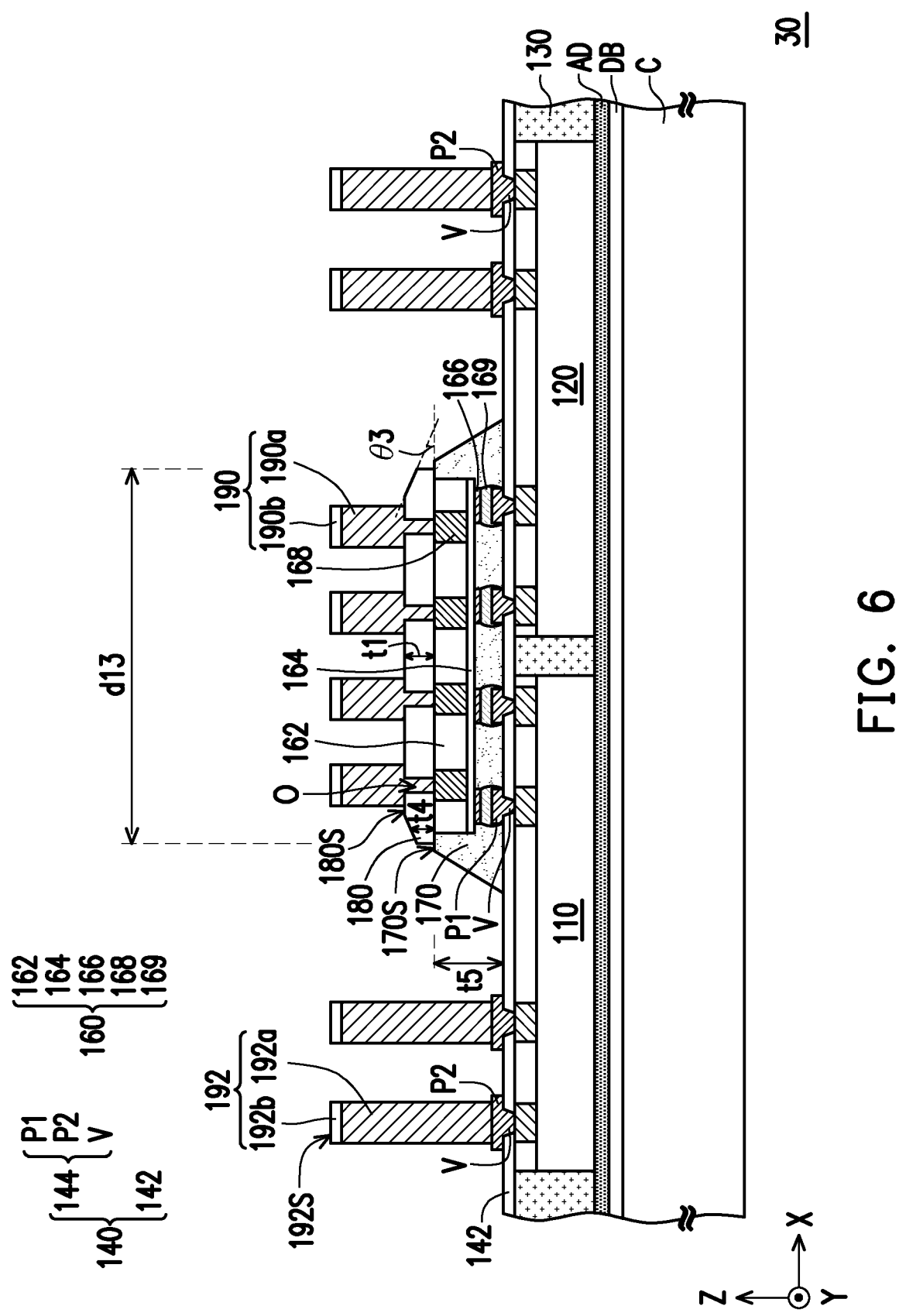
FIG. 6 is a schematic cross-sectional view illustrating a semiconductor package in accordance with some alternative embodiments of the disclosure.
Figure 7:
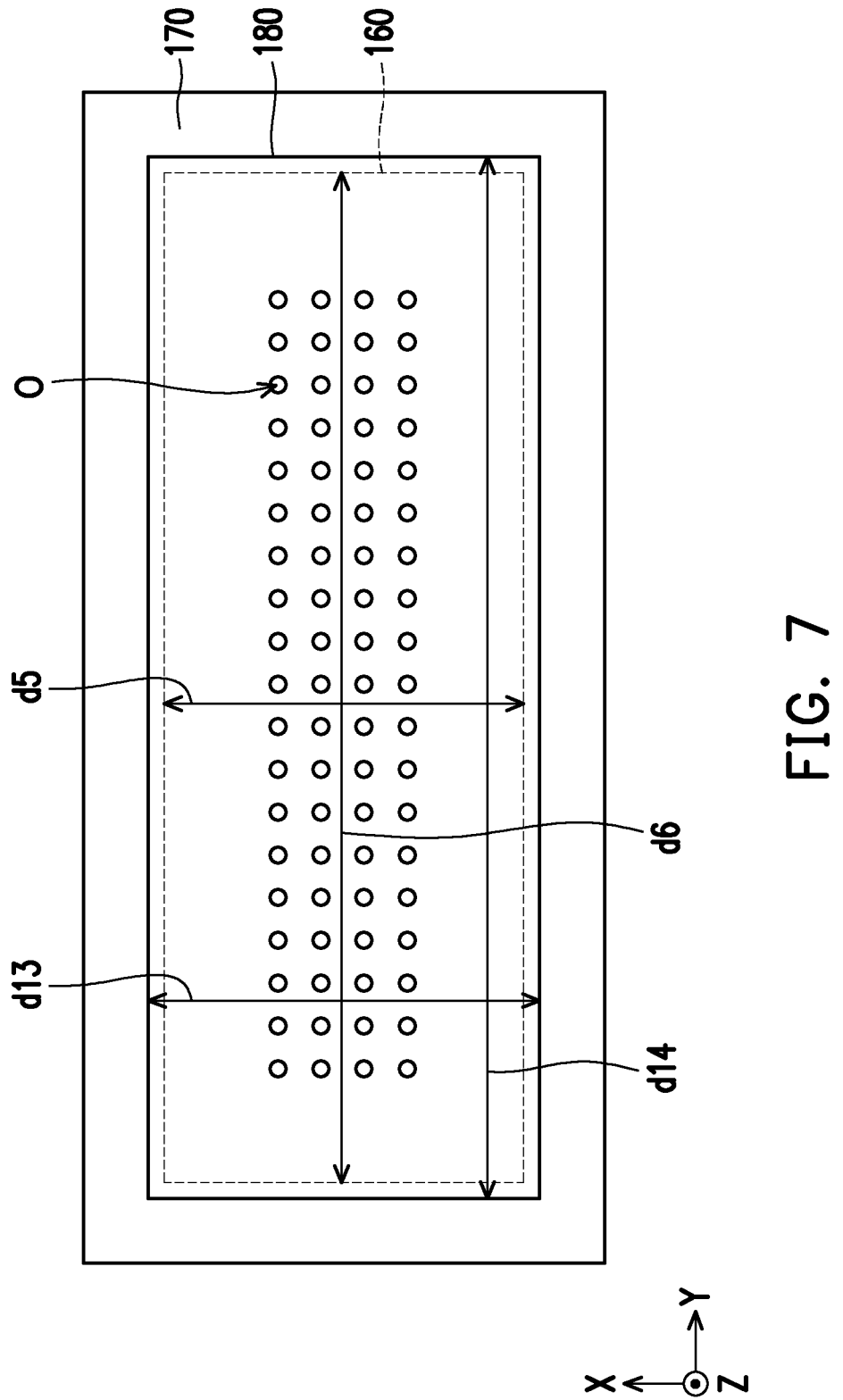
FIG. 7 is a schematic top view illustrating a portion of the semiconductor package of FIG. 6 in accordance with some embodiments of the disclosure.

FIG. 6 is a schematic cross-sectional view illustrating a semiconductor package 30 in accordance with some alternative embodiments of the disclosure. FIG. 7 is a schematic top view illustrating a portion of the semiconductor package of FIG. 6 in accordance with some embodiments of the disclosure. The semiconductor package 30 illustrated in FIG. 7 is similar to the semiconductor package 10 illustrated in FIG. 1J, hence the same reference numerals are used to refer to the same or liked parts, and its detailed description will be omitted herein. The main differences between the semiconductor package 30 and the semiconductor package 10 lie in that: the size of the patterned dielectric layer 180 in the semiconductor package 30 is greater than the size of the patterned dielectric layer 180 in the semiconductor package 10, and the thickness of the underfill layer 170 in the semiconductor package 30 is reduced. In detail, as shown in FIG. 1J, FIG. 2A, FIG. 6 and FIG. 7, along the direction X, the dimension d13 of the patterned dielectric layer 180 in the semiconductor package 30 is greater than the dimension d1 of the patterned dielectric layer 180 in the semiconductor package 10; and along the direction Y, the dimension d14 of the patterned dielectric layer 180 in the semiconductor package 30 is greater than the dimension d3 of the patterned dielectric layer 180 in the semiconductor package 10. Further, as shown in FIG. 6, along the direction Z, thickness t5 of the underfill layer 170 ranges from about 10 μm to about 40 μm. In some embodiments, according to the descriptions with respect to FIGS. 1C-1D, those skilled in the art should understand that the underfill layer 170 of the semiconductor package 30 with the reduced thickness t1 may be formed by during the thinning process, after the TSVs 168 of the die 160 are revealed by the semiconductor substrate 162, the die 160 and the underfill layer 170 are further removed to reduce the thicknesses of the die 160 and the underfill layer 170.

Further, as shown in FIG. 6 and FIG. 7, in the semiconductor package 30, along the direction Z, the vertical projection of the die 160 onto the redistribution structure 140 is located within the span of the vertical projection of the patterned dielectric layer 180 onto the redistribution structure 140, and the vertical projection of the patterned dielectric layer 180 onto the redistribution structure 140 is located within the span of the vertical projection of the underfill layer 170 onto the redistribution structure 140. That is to say, in the semiconductor package 30, the side surfaces of the patterned dielectric layer 180 all overlap with the underfill layer 170 along the direction Z, and the patterned dielectric layer 180 extends from the die 160 toward the underfill layer 170 to cover the interface between the underfill layer 170 and the side surfaces of the die 160. In other words, in the semiconductor package 30, a dimension d13 along the direction X and a dimension d14 along the direction Y of the patterned dielectric layer 180 are both greater than the dimension d5 along the direction X and the dimension d6 along a direction Y of the die 160. It is noted that in the semiconductor package 30, by increasing the size (area) of the patterned dielectric layer 180 to cover the interface between the underfill layer 170 and the side surfaces of the die 160, the coverage of the seed layer used for forming the conductive terminals 190 and the conductive terminals 192 is improved, therefore a better TTV of each of the conductive terminals 190 and the conductive terminals 192 can be achieved. In some embodiments, in the semiconductor package 30, a TTV of the conductive via of the conductive terminal 190 is greater than or equal to 0 and less than about 1 μm; and a TTV of the conductive pattern of the conductive terminal 190 is greater than or equal to 0 and less than about 1 μm.

Further, as shown in FIG. 6, in the semiconductor package 30, the surface 180S of the patterned dielectric layer 180 is not planar. In other words, in the semiconductor package 30, the surface 180S of the patterned dielectric layer 180 is an uneven surface. In some embodiments, according to the descriptions with respect to FIG. 1E and FIG. 1G, those skilled in the art should understand that the patterned dielectric layer 180 of the semiconductor package 30 with the uneven surface 180S may be formed by conformally forming a dielectric material over the redistribution structure 140, the underfill layer 170 and the die 160 by spin-coating, CVD, PVD, or the like; performing a baking process with a low baking temperature, for example, ranging from about 90° C. to less than about 160° C.; and performing a lithography patterning process on the dielectric material that has been baked.

Further, as shown in FIG. 6, an edge portion of the surface 180S is inclined with respect to the back surface 160b of the die 160, while a portion of the surface 180S that is located on the TSV 165 and under the conductive pattern of the first portion 190a of each conductive terminal 190 is parallel with the back surface 160b of the die 160. In some embodiments, as shown in FIG. 6, the included angle θ3 between the edge portion of the surface 180S of the patterned dielectric layer 180 and the back surface 160b of the die 160 is equal to or greater than about 10 degrees and equal to or less than about 30 degrees. From another point of view, as shown in FIG. 3, the thickness t1 at center of the patterned dielectric layer 180 is different from a thickness t4 at an edge of the patterned dielectric layer 180. That is, a thickness of the patterned dielectric layer 180 varies throughout the patterned dielectric layer 180. In some embodiments, in the semiconductor package 30, a TTV of the patterned dielectric layer 180 is greater than or equal to 0 μm and less than or equal to about 2 μm. Further, according to the descriptions with respect to FIG. 1G, those skilled in the art should understand that the portion of the surface 180S of the patterned dielectric layer 180 that is located on the TSV 165 and under the conductive pattern of each conductive terminal 190 may be not parallel with the back surface 160b of the die 160, and be slightly inclined with respect to the back surface 160b of the die 160 to form an included angle (not shown) being greater than 0 degree and equal to or less than about 10 degrees. As such, it is noted that in the semiconductor package 30, even the patterned dielectric layer 180 is formed from the conformal dielectric material, the patterned dielectric layer 180 still provides a platform with a high degree of flatness for the conductive terminals 190, such that each conductive terminal 190 is formed with better TTV. Further, it is noted that in the semiconductor package 30, by reducing the thickness of the underfill layer 170, the topography that the conformally formed dielectric material formed on becomes smoother, such that well-controlled and better flatness of the surface 180S of the patterned dielectric layer 180 for accommodating the later-formed conductive terminals 190 with better TTVs is achievable.

Figure 8:
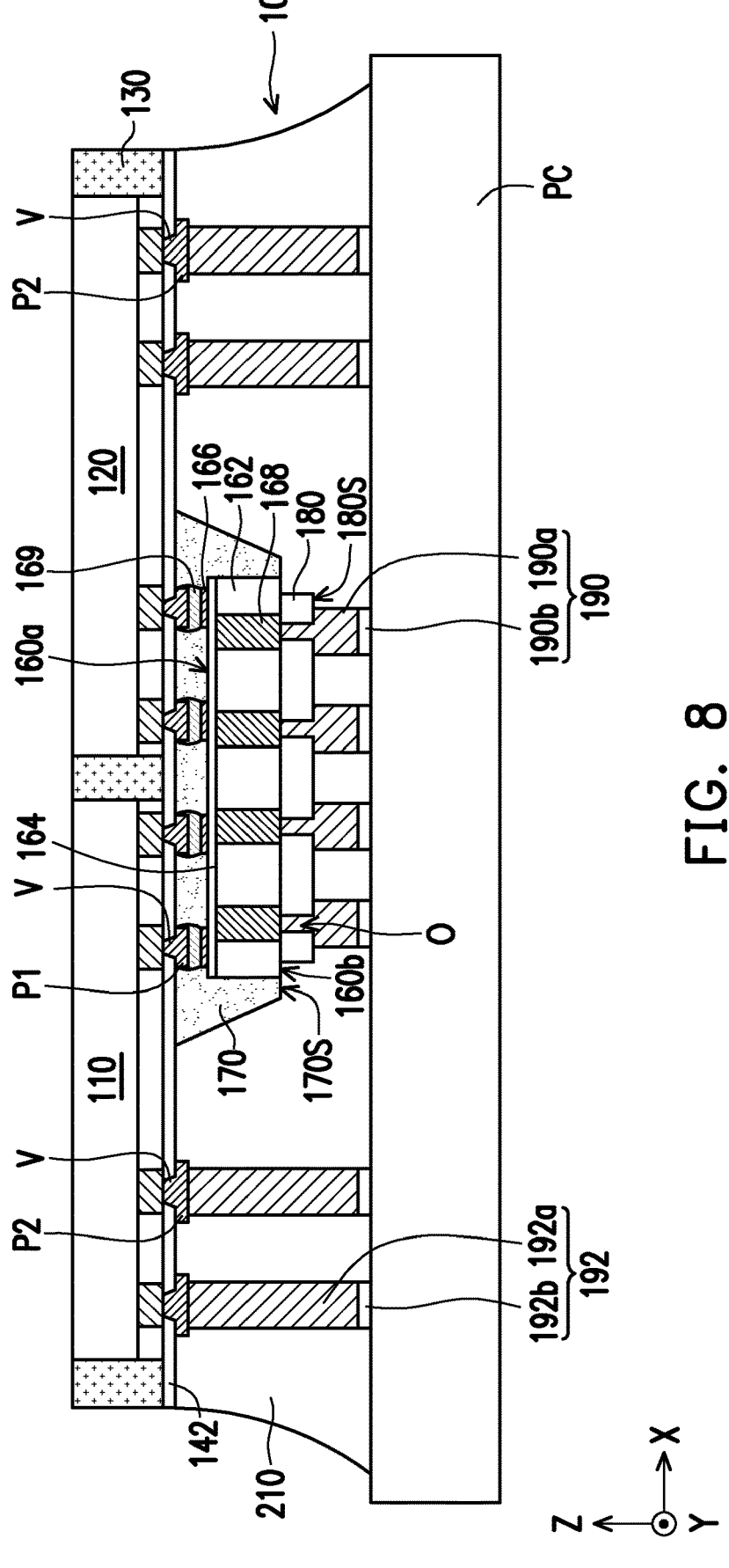
FIG. 8 is a schematic cross-sectional view illustrating an application of a semiconductor package according to some exemplary embodiments of the disclosure.

FIG. 8 is a schematic cross-sectional view illustrating an application of a semiconductor package according to some exemplary embodiments of the disclosure. Referring to FIG. 8, the semiconductor package 10 as shown in FIG. 1J may be mounted onto a package component PC. The package component PC may include an interposer (with or without active/passive devices), another semiconductor package, a device die, a mounting substrate, a packaging substrate, a circuit board, combinations thereof, or the like. The electrical signals of the semiconductor dies (e.g., die 110, die 120, and/or die 160) in the semiconductor package 10 may be transmitted through the conductive terminals 190 and the conductive terminals 192 to the package component PC. For example, the conductive terminals 190 and the conductive terminals 192 of the semiconductor package 10 are placed on the contact pads (not shown) of the package component PC, and then a reflow process may be performed to bond the semiconductor package 10 to the package component PC. In some embodiments, an underfill layer 210 is optionally formed to fill in a space defined by the conductive terminals 190 and the conductive terminals 192 of the semiconductor package 10 and the package component PC, thereby improving the attachment therebetween.

Although FIG. 8 illustrates that the semiconductor package 10 is bonded to the package component PC, those skilled in the art should understand that the semiconductor package 20 described in conjunction with FIGS. 4 and 5, or the semiconductor package 30 described in conjunction with FIGS. 6 and 7 may be used in replacement of the semiconductor package 10.

In accordance with an embodiment, a semiconductor package including a die, an underfill layer, a patterned dielectric layer, and a plurality of conductive terminals is provided. The die has a front surface and a back surface opposite to the front surface. The underfill layer encapsulates the die, wherein a surface of the underfill layer and the back surface of the die are substantially coplanar to one another. The patterned dielectric layer is disposed on the back surface of the die. The plurality of conductive terminals are disposed on and in contact with a surface of the patterned dielectric layer and partially embedded in the patterned dielectric layer to be in contact with the die, wherein a portion of the surface of the patterned dielectric layer that directly under each of the conductive terminals is substantially parallel with the back surface of the die.

In accordance with an embodiment, a semiconductor package including a first die and a second die, an encapsulant, a redistribution structure, a third die, an underfill layer, a patterned dielectric layer, a plurality of first conductive terminals and a plurality of second conductive terminals is provided. The first die and the second die are disposed aside the first die along a first direction. The redistribution structure is disposed on the encapsulant, the first die and the second die, and electrically connected with the first die and the second die. The third die is disposed on the redistribution structure, wherein the third die has a front surface and a back surface opposite to the front surface, the front surface faces toward the redistribution structure, and the third die is electrically coupled to the first die and the second die through the redistribution structure. The underfill layer encapsulates and covers side surfaces of the third die. The patterned dielectric layer is disposed on the back surface of the third die. The plurality of first conductive terminals are disposed on the first die, wherein each of the first conductive terminals includes a conductive via embedded in the patterned dielectric layer, and a conductive pattern located on the conductive via and laterally extending over a surface of the patterned dielectric layer along first direction, and a TTV of the conductive pattern of each of the first conductive terminals is greater than or equal to 0 µm and less than or equal to about 5 µm. The plurality of second conductive terminals surround the first conductive terminals and are disposed on and in contact with the redistribution structure.

In accordance with an embodiment, a manufacturing method of a semiconductor package including the following steps is provided. A die is bonded with a redistribution structure, wherein the die has a front surface facing toward the redistribution structure and a back surface opposite to the front surface. The die is laterally encapsulated with an underfill layer. A patterned dielectric layer having a surface with a substantially planar profile is formed on the back surface of the die. A plurality of conductive terminals penetrating through the patterned dielectric layer are formed to be in electrical contact with the die and laterally extend over the surface of the patterned dielectric layer, wherein the substantially planar profile of the surface of the patterned dielectric layer is directly under each of the conductive terminals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a first die having a front surface and a back surface opposite to the front surface;

an underfill layer encapsulating the first die, wherein a surface of the underfill layer and the back surface of the first die are substantially coplanar to one another;
a patterned dielectric layer disposed on the back surface of the first die;
a plurality of conductive terminals disposed on and in contact with a surface of the patterned dielectric layer and partially embedded in the patterned dielectric layer to be in contact with the first die, wherein a portion of the surface of the patterned dielectric layer that is disposed directly under each of the conductive terminals is substantially parallel with the back surface of the first die; and
a second die and a third die disposed closer to the front surface of the first die than to the back surface of the first die and electrically coupled to the first die, wherein the third die is disposed laterally adjacent to the second die.

2. The semiconductor package of claim 1, wherein the surface of the patterned dielectric layer is substantially planar.

3. The semiconductor package of claim 2, wherein side surfaces of the patterned dielectric layer connecting with the surface of the patterned dielectric layer overlap with the first die.

4. The semiconductor package of claim 2, wherein a total thickness variation (TTV) of the patterned dielectric layer is greater than or equal to 0 µm and less than about 2 µm.

5. The semiconductor package of claim 1, wherein side surfaces of the patterned dielectric layer connecting with the surface of the patterned dielectric layer overlap with the underfill layer and is on contact with the surface of the underfill layer.

6. The semiconductor package of claim 5, wherein a TTV of the patterned dielectric layer is greater than or equal to 0 µm and less than or equal to about 2 µm.

7. The semiconductor package of claim 5, wherein along a direction substantially parallel with the back surface of the first die, a ratio of a minimum distance between an outer edge of the underfill layer and the side surface of the first die facing toward the outer edge of the underfill layer to a dimension of the first die ranges from 0.05:1 to 0.5:1.

8. The semiconductor package of claim 5, wherein a thickness of the underfill layer ranges from about 10 µm to about 40 µm.

9. A semiconductor package, comprising:
a first die and a second die disposed aside the first die along a first direction;
an encapsulant laterally encapsulating the first die and the second die along the first direction;
a redistribution structure, disposed on the encapsulant, the first die and the second die, and electrically connected with the first die and the second die;
a third die, disposed on the redistribution structure, wherein the third die has a front surface and a back surface opposite to the front surface, the front surface faces toward the redistribution structure, and the third die is electrically coupled to the first die and the second die through the redistribution structure;
an underfill layer encapsulating and covering side surfaces of the third die;
a patterned dielectric layer disposed on the back surface of the third die;
a plurality of first conductive terminals disposed on the first die, wherein each of the first conductive terminals includes a conductive via embedded in the patterned dielectric layer, and a conductive pattern located on the conductive via and laterally extending over a surface of the patterned dielectric layer along first direction, and a total thickness variation (TTV) of the conductive pattern of each of the first conductive terminals is greater than or equal to 0 μm and less than or equal to about 5 μm; and a plurality of second conductive terminals surrounding the first conductive terminals and disposed on and in contact with the redistribution structure.

10. The semiconductor package of claim 9, wherein the first conductive terminals and the second conductive terminals are controlled collapse chip connection (C4) bumps.

11. The semiconductor package of claim 9, wherein a surface of each of the first conductive terminals is at substantially the same level as a surface of each of the second conductive terminals.

12. The semiconductor package of claim 9, wherein along a second direction perpendicular to the first direction, a vertical projection of the patterned dielectric layer onto the redistribution structure is located within a span of a vertical projection of the third die onto the redistribution structure.

13. The semiconductor package of claim 12, wherein the surface of the patterned dielectric layer is a substantially planar surface.

14. The semiconductor package of claim 9, wherein the patterned dielectric layer laterally extends along the first direction beyond the side surfaces of the third die to be in contact with the underfill layer.

15. The semiconductor package of claim 14, wherein a thickness of the patterned dielectric layer varies throughout the patterned dielectric layer.

16. A manufacturing method of a semiconductor package, comprising:

providing a first die and a second die laterally encapsulated with an encapsulant;

forming a redistribution structure on the first die, the second die and the encapsulant;

bonding a third die with the redistribution structure, wherein the third die has a front surface facing toward the redistribution structure and a back surface opposite to the front surface;

laterally encapsulating the third die with an underfill layer;

forming a patterned dielectric layer having a surface with a substantially planar profile on the back surface of the third die; and forming a plurality of conductive terminals penetrating through the patterned dielectric layer to be in electrical contact with the die and laterally extending over the surface of the patterned dielectric layer, wherein the substantially planar profile of the surface of the patterned dielectric layer is directly under each of the conductive terminals.

17. The manufacturing method according to claim 16, wherein the step of laterally encapsulating the third die with the underfill layer further comprises:

forming the underfill layer between the die and the redistribution structure, and surrounding the third die; and performing a thinning process on the back surface of the third die and the underfill layer to form a surface of the underfill layer being substantially coplanar with the back surface of the third die.

18. The manufacturing method according to claim 16, wherein forming the patterned dielectric layer having the surface with the substantially planar profile on the back surface of the third die further comprises:

forming a dielectric layer with a substantially planar top surface over the redistribution structure, the underfill layer and the third die; and partially removing the dielectric layer by performing a lithography patterning process.

19. The manufacturing method according to claim 18, wherein the dielectric layer includes two conformally formed sublayers.

20. The manufacturing method according to claim 18, wherein the dielectric layer is a non-conformal dielectric layer, and a material of the dielectric layer includes epoxy-based material, polyimide, or acrylate.

* * * * *